(12) United States Patent
Yamaji et al.

(10) Patent No.: US 9,099,959 B2
(45) Date of Patent: Aug. 4, 2015

(54) FRACTIONAL FREQUENCY DIVIDING CIRCUIT AND TRANSMITTER

(71) Applicant: KABUSHIKI KAISHA TOSHIBA, Minato-ku, Tokyo (JP)

(72) Inventors: Takafumi Yamaji, Yokohama (JP); Tsuneo Suzuki, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/167,726

(22) Filed: Jan. 29, 2014

(65) Prior Publication Data

US 2015/0055726 A1 Feb. 26, 2015

(30) Foreign Application Priority Data

Aug. 26, 2013 (JP) .................. 2013-174920

(51) Int. Cl.
*H03K 23/68* (2006.01)
*H03B 19/14* (2006.01)
*H04B 1/04* (2006.01)

(52) U.S. Cl.
CPC .................. *H03B 19/14* (2013.01); *H04B 1/04* (2013.01); *H04B 2001/0491* (2013.01)

(58) Field of Classification Search
USPC .................. 375/295, 371, 377; 327/115, 117; 377/48
See application file for complete search history.

(56) References Cited

U.S. PATENT DOCUMENTS 5,446,770 A 8/1995 Urabe et al.
6,421,530 B1 7/2002 Adachi et al.
8,467,762 B2 6/2013 Kokatsu
8,791,729 B2 * 7/2014 Woelk et al. .................. 327/117
2005/0036566 A1 * 2/2005 Eikenbroek et al. .......... 375/295
2014/0185736 A1 * 7/2014 Chandrashekar et al. ...... 377/48

FOREIGN PATENT DOCUMENTS

| JP | 06-291697 A | 10/1994 |
|---|---|---|
| JP | 09-181527 A | 7/1997 |
| JP | 10-098409 A | 4/1998 |
| JP | 2003-078434 A | 3/2003 |
| JP | 2006-067520 A | 3/2006 |
| JP | 2012-049899 A | 3/2012 |

OTHER PUBLICATIONS

J.A. Weldon et al., "A 1.75-GHz highly integrated narrow-band CMOS transmitter with harmonic-rejection mixers", IEEE Journal of Solid-State Circuits, vol. 36, No. 12, pp. 2003-2015.

* cited by examiner

*Primary Examiner* — Kevin Kim
(74) *Attorney, Agent, or Firm* — White & Case LLP

(57) ABSTRACT

According to one embodiment, there is provided a fractional frequency dividing circuit including an integral frequency dividing circuit and an adjustment circuit. The integral frequency dividing circuit is configured to convert a reference signal to K (K is a positive integer) phase signals. Each of the K phase signals has a frequency of one nth (n is a positive integer) of the reference signal and has different phases from each other. The adjustment circuit is configured to weighting-add a plurality of signals corresponding to the K phase signals and generate a fractional-frequency-divided signal. The fractional-frequency-divided signal has a frequency of m times (m is a positive integer that is not multiplies of n) of each of the plurality of phase signals.

19 Claims, 23 Drawing Sheets

FRACTIONAL FREQUENCY DIVIDING CIRCUIT AND TRANSMITTER

CROSS-REFERENCE TO RELATED APPLICATIONS

This application is based upon and claims the benefit of priority from Japanese Patent Application No. 2013-174920, filed on Aug. 26, 2013; the entire contents of which are incorporated herein by reference.

FIELD

Embodiments described herein relate generally to a fractional frequency dividing circuit and a transmitter.

BACKGROUND

In a direct conversion transmitter, if an oscillating frequency of an oscillator of when generating a local signal and a frequency of an output signal of a power amplifier are in a relationship of being the same or integral multiples, the noise corresponding to the output signal of the power amplifier may influence the operation of the oscillator. In this case, the local signal may distort and the modulation accuracy in a mixer may degrade. With regards thereto, it is proposed to pass the output of the oscillator through a fractional frequency dividing circuit to generate a local signal, and to have the oscillating frequency of the oscillator and the frequency of the output signal of the power amplifier in a fractional relationship. In this case, it is desired to reduce the unnecessary tone with a simple configuration.

DETAILED DESCRIPTION

In general, according to one embodiment, there is provided a fractional frequency dividing circuit including an integral frequency dividing circuit and an adjustment circuit. The integral frequency dividing circuit is configured to convert a reference signal to K (K is a positive integer) phase signals. Each of the K phase signals has a frequency of one nth (n is a positive integer) of the reference signal and has different phases from each other. The adjustment circuit is configured to weighting-add a plurality of signals corresponding to the K phase signals and generate a fractional-frequency-divided signal. The fractional-frequency-divided signal has a frequency of m times (m is a positive integer that is not multiplies of n) of each of the plurality of phase signals.

Exemplary embodiments of a fractional frequency dividing circuit will be explained below in detail with reference to the accompanying drawings. The present invention is not limited to the following embodiments.

It should be noted that in the specification the term "weighting-add" can be rephrased as "weight-and-sum". Similarly, the term "weighting-adding" can be rephrased as "weighting-and-summing".

First Embodiment

Figure 24:
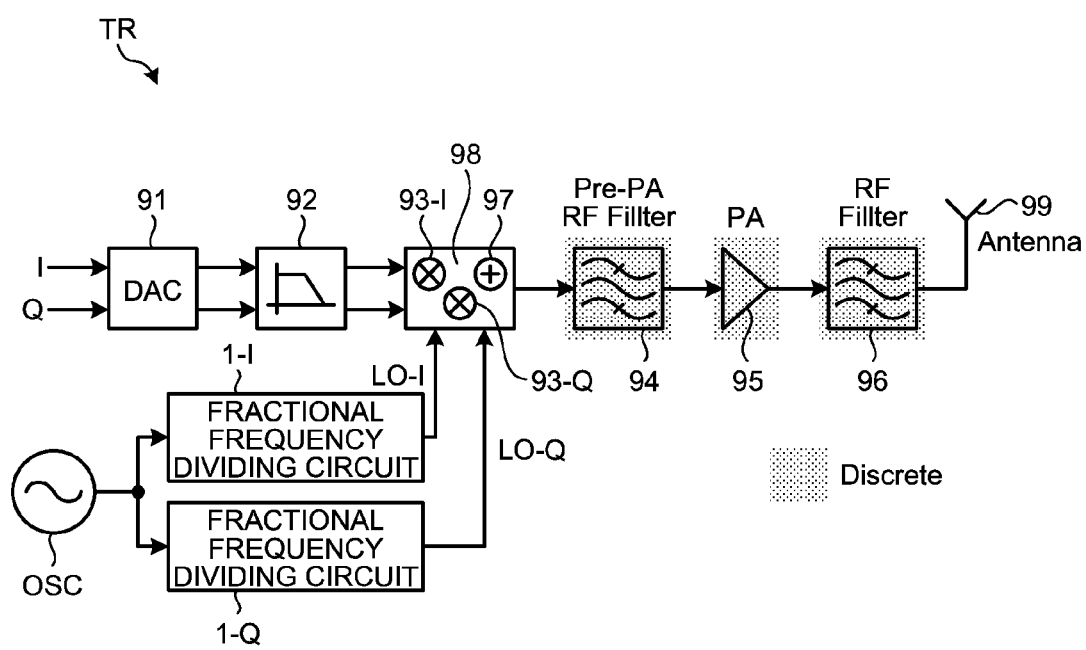
FIG. 24 is a view illustrating a configuration of a transmitter applied with a fractional frequency dividing circuit according to a basic mode.

A fractional frequency dividing circuit according to a basic mode will be described using FIG. 24 before describing a fractional frequency dividing circuit according to a first embodiment. FIG. 24 is a view illustrating a configuration of a transmitter TR applied with the fractional frequency dividing circuit according to the basic mode.

The transmitter TR is a transmitter adopting a direct conversion method. The transmitter TR modulates a local signal, which has substantially the same frequency as the frequency of the signal to be transmitted, with a modulation signal.

Specifically, as illustrated in FIG. 24, the transmitter TR includes a DA converter (DAC) 91, a filter 92, a mixer 98, a filter 94, a power amplifier 95, a filter 96, and an antenna 99.

The DA converter 91 D/A-converts I data and Q data corresponding to the signal to transmit to generate an I signal (analog signal) and a Q signal (analog signal), and outputs the same to the filter 92. The filter 92 performs filtering process on the I signal and the Q signal and outputs the result to the mixer 98.

The mixer 98 includes a mixer 93-I, a mixer 93-Q, and an adder 97. The mixer 93-I modulates a local signal LO-I with the I signal (modulation signal) to generate an I component signal. The mixer 93-Q modulates a local signal LO-Q with the Q signal (modulation signal) to generate a Q component signal. The local signals LO-I, LO-Q are signals generated according to an oscillation signal oscillated by an oscillator OSC and output from the oscillator OSC. The frequencies of the local signals LO-I, LO-Q are substantially the same as the frequency of the signal to be transmitted.

The adder 97 adds the I component signal and the Q component signal to generate the signal to be transmitted, and outputs the same to the filter 94.

The filter 94 performs filtering process on the signal to be transmitted and outputs the result to the power amplifier 95. The power amplifier 95 power-amplifies the signal performed with the filtering process, and outputs to the filter 96. The filter 96 performs filtering process on the signal subjected to power amplification, and outputs the result to the antenna 99. The antenna 99 transmits the signal received from the filter 96 into space as a radio signal.

In the transmitter TR, if the oscillating frequency of the oscillator OSC of when generating the local signal LO and the frequency of the output signal of the power amplifier 95 are in a relationship of being the same or integral multiples, the noise corresponding to the output signal of the power amplifier 95 may influence the operation of the oscillator OSC. For example, when the noise corresponding to the output signal of the power amplifier 95 reaches the oscillator OSC via a power supply circuit and/or space, the oscillating frequency of the oscillator OSC may fluctuate or the output waveform of the oscillator OSC may distort. In this case, the local signal may distort and the modulation accuracy in the mixer 98 may degrade.

In the basic mode, on the other hand, the output of the oscillator OSC is passed through the fractional frequency dividing circuits 1-I, 1-Q to generate the local signals LO-I, LO-Q, and the oscillating frequency of the oscillator OSC and the frequency of the output signal of the power amplifier 95 are in a non-integer fractional relationship. The noise corresponding to the output signal of the power amplifier 95 thus can be suppressed from influencing the operation of the oscillator OSC.

The fractional frequency dividing circuits 1-I, 1-Q are circuits corresponding to the I signal and the Q signal, respectively. The fractional frequency dividing circuits—I, 1-Q are basically similar other than that the phases of the local signals LO-I, LO-Q to generate differ by $\pi/2$, and thus will be mainly described as the fractional frequency dividing circuit 1.

Figure 25:
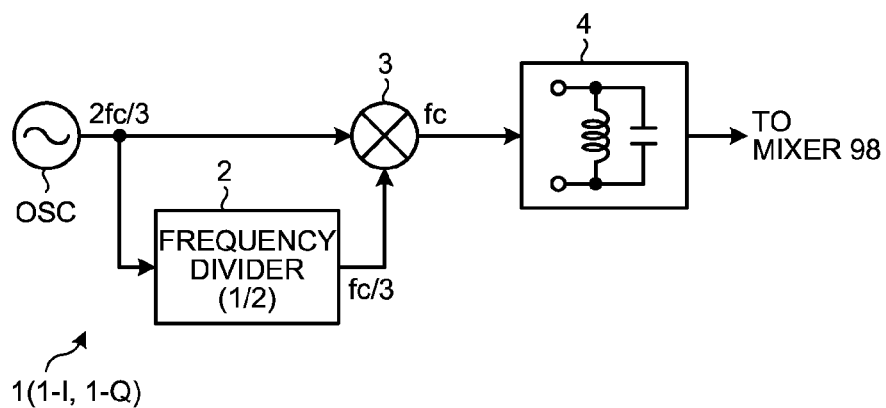
FIG. 25 is a view illustrating a configuration of the fractional frequency dividing circuit according to the basic mode.

Specifically, as illustrated in FIG. 25, the fractional frequency dividing circuit 1 frequency-divides a reference signal output from the oscillator OSC to a signal having a frequency of 3/2 of the reference signal. In other words, the oscillating frequency of the oscillator OSC is adjusted in advance to become 2fc/3, where fc is the frequency of the signal to be transmitted.

For example, the fractional frequency dividing circuit 1 includes a frequency divider 2, a multiplier 3, and a band pass filter 4. The frequency divider 2 frequency-divides by two the reference signal output from the oscillator OSC and generates frequency-divided signals having a frequency of 2fc/3× ½=fc/3.

The multiplier 3 multiplies the reference signal and the frequency-divided signal, and generates a fractional-frequency-divided signal having a frequency of 2fc/3+fc/3=fc. In other words, the multiplier 3 multiplies the reference signal and the frequency-divided signal to add the frequency of the reference signal and the frequency of the frequency-divided signal. The fractional-frequency-divided signal generated by the multiplier 3 includes unnecessary tones 3LO2, 5LO2, 7LO2, as illustrated in the lower left diagram of FIG. 26.

Figure 26:
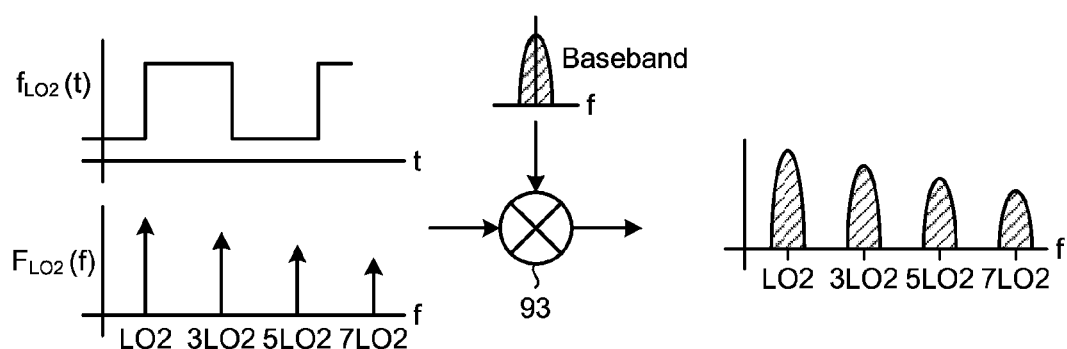
FIG. 26 is a view illustrating an operation of the fractional frequency dividing circuit according to the basic mode.

If the fractional-frequency-divided signal is used directly as the local signals LO-I, LO-Q and modulation is carried out in the mixer 93, the signal after the modulation may also contain the unnecessary tones 3LO2, 5LO2, 7LO2, as illustrated in the right diagram of FIG. 26.

In the basic mode, the fractional-frequency-divided signal generated by the multiplier 3 is passed through the band pass filter 4, and then provided to the mixer 98. The band pass filter 4 is configured by a parallel LC resonance circuit, and operates to suppress the unnecessary tones 3LO2, 5LO2, 7LO2 in the fractional-frequency-divided signal.

However, since the parallel LC resonance circuit occupies a large chip area, the fractional frequency dividing circuit tends to become large and the transmitter TR tends to become large. Furthermore, since the parallel LC resonance circuit requires the adjustment mechanism of the resonance frequency, the configuration of the fractional frequency dividing circuit tends to become complex, and the configuration of the transmitter TR tends to become complex. The manufacturing cost of the transmitter TR thus may increase.

In the present embodiment, the unnecessary tone is aimed to be reduced with a simple configuration without using the parallel LC resonance circuit in the fractional frequency dividing circuit 100.

Figure 1:
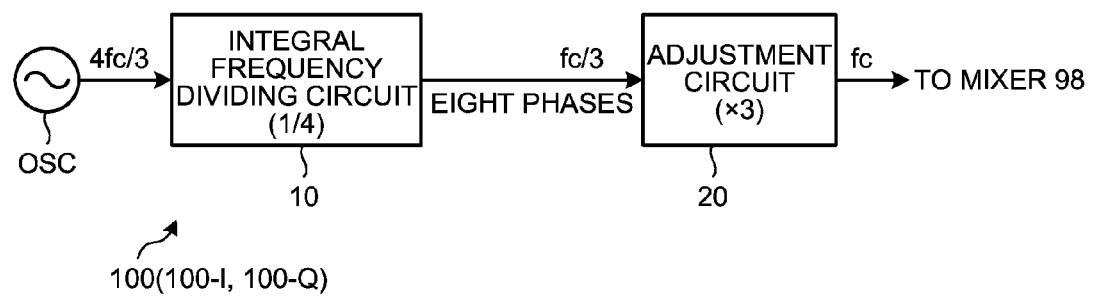
FIG. 1 is a view illustrating a configuration of a fractional frequency dividing circuit according to a first embodiment.

Specifically, as illustrated in FIG. 1, the fractional frequency dividing circuit 100 frequency-divides the reference signal output from the oscillator OSC to a signal having a frequency of m/n of the reference signal. Here, n is a positive integer, m is a positive integer that is not multiples of n, and m/n is a fraction that does not become a whole number. In other words, the oscillating frequency of the oscillator OSC is adjusted in advance to become n×fc/m, where fc is the frequency of the signal to be transmitted. In FIG. 1, a case in which m=3, n=4 is illustrated.

The fractional frequency dividing circuit 100 includes an integral frequency dividing circuit 10 and an adjustment circuit 20. The integral frequency dividing circuit 10 frequency-divides into n the reference signal output from the oscillator OSC. The integral frequency dividing circuit 10 thereby converts the reference signal to K phase signals. K is a positive integer. For example, K=2n. The K phase signals each has a frequency of one nth of the reference signal. The K phase signals each has a frequency of n×fc/m×1/n=fc/m. The K phase signals have different phases from each other. Among the K phase signals, a phase difference with the phase signal having the closest phase is equal (e.g., $2\pi/K$).

For example, in the case of m=3, n=4, the oscillating frequency of the oscillator OSC is adjusted in advance to become 4fc/3. The integral frequency dividing circuit 10 frequency-divides into four the reference signal, and generates a multi-phase signal of eight phases, that is, eight phase signals. The eight phase signals each has a frequency of fc/3. The eight phase signals have different phases from each other, and the phase difference with the phase signal having the closest phase is equal at substantially $2\pi/8=\pi/4$.

The integral frequency dividing circuit 10 outputs the converted K phase signals to the adjustment circuit 20. For example, in the case of m=3, n=4, the integral frequency dividing circuit 10 outputs a multi-phase signal of eight phases, that is, eight phase signals to the adjustment circuit 20.

The adjustment circuit 20 receives K phase signals from the integral frequency dividing circuit 10. The adjustment circuit 20 weighting-adds the K phase signals to generate a fractional-frequency-divided signal. The fractional-frequency-divided signal has a frequency m times each of the plurality of phase signals. The fractional-frequency-divided signal has a frequency of fc/m×m=fc. The adjustment circuit 20 weighting-adds the K phase signals to adjust the waveform of the signal so as to approach a sine wave while frequency-multiplying by m times each of the K phase signals. For example, the adjustment circuit 20 can adjust the waveform of the signal to a waveform of stair-like form (see upper left diagram of FIG. 4) in correspondence with the sine wave while frequency-multiplying by m times each of the K phase signals. In other words, the adjustment circuit 20 can function as the FIR (Finite Impulse Response) filter so as to suppress the unnecessary tones 3LO2, 5LO2, 7LO2.

For example, in the case of m=3, n=4, the adjustment circuit 20 frequency-multiplies by three times the eight phase signals and performs waveform adjustment to generate the fractional-frequency-divided signal. The fractional-frequency-divided signal has a frequency of fc.

The adjustment circuit 20 outputs the generated fractional-frequency-divided signal to the mixer 98.

Figure 2:
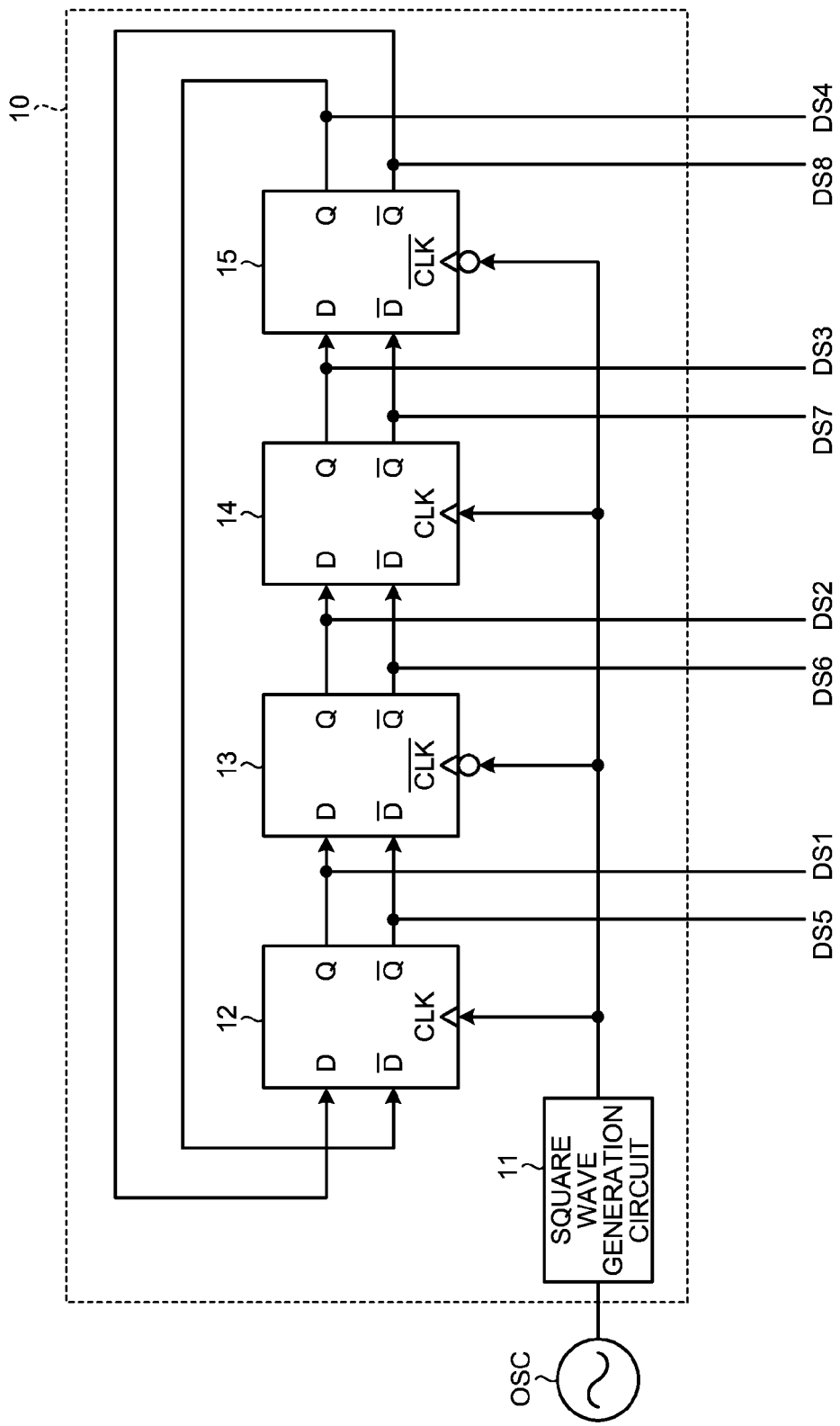
FIG. 2 is a view illustrating a configuration of an integral frequency dividing circuit according to the first embodiment.

The configuration of the integral frequency dividing circuit 10 will now be described using FIG. 2. FIG. 2 is a view illustrating a configuration of the integral frequency dividing circuit 10.

The integral frequency dividing circuit 10 includes a square wave generation circuit 11, and K/2 delay circuits 12 to 15. The square wave generation circuit 11 receives a reference signal (e.g., sine wave) output from the oscillator OSC. The square wave generation circuit 11 shapes the waveform of the reference signal to a square wave, and generates a square wave signal corresponding to the reference signal.

The fractional frequency dividing circuit 100-I for the I signal and the fractional frequency dividing circuit 100-Q for the Q signal can be made common.

The square wave generation circuit 11 provides the generated square wave signal to control terminals of the K/2 delay circuits 12 to 15.

The K/2 delay circuits 12 to 15 transfer the signal in synchronization with the reference signal and output two signals, which phases are inverted from each other. Each delay circuit 12 to 15 is, for example, a differential D latch circuit or a gated SR latch circuit. In the integral frequency dividing circuit 10, for example, the differential D latch circuit is combined for K/2=n stages. In the integral frequency dividing circuit 10, the differential D latch circuit for latching at the rising edge of the square wave signal and the differential D latch circuit for latching at the falling edge of the square wave signal are alternately combined. In the integral frequency dividing circuit 10, a signal is fed back from the differential D latch circuit of the final stage to the differential D latch circuit of the first stage so that the non-inverted phase and the inverted phase are interchanged between the output of the differential D latch circuit of the final stage and the input of the differential D latch circuit of the first stage. The n frequency dividing circuits are thereby configured. In other words, the K/2 delay circuits 12 to 15 can function as a shift register for transferring the signal at substantially half-cycle of the square wave signal.

In FIG. 2, a case in which m=3, n=4, and K=2n=8, and each delay circuit 12 to 15 is the differential D latch circuit is illustrated. In FIG. 2, four-frequency-dividing circuits are configured by combining the differential D latch circuit for 8/2=4 stages.

In other words, the Q terminals of the delay circuits 12 to 14 are respectively connected to the D terminals of the delay circuits 13 to 15, and the Q⁻ terminals of the delay circuits 12 to 14 are connected to the D⁻ terminals of the delay circuits 13 to 15. The Q terminal of the delay circuit 15 of the final stage is connected to the D⁻ terminal of the delay circuit 12 of the first stage, and the Q⁻ terminal of the delay circuit 15 of the final stage is connected to the D terminal of the delay circuit 12 of the first stage. The delay circuits 12, 14 receive the square wave signal at the clock terminal CLK, and the delay circuits 13, 15 receive the square wave signal at the inverted clock terminal CLK⁻.

The delay circuit 12 outputs the phase signals DS1, DS5 from the Q terminal and the Q terminal, respectively. The delay circuit 13 outputs the phase signals DS2, DS6 from the Q terminal and the Q terminal, respectively. The delay circuit 14 outputs the phase signals DS3, DS7 from the Q terminal and the Q⁻ terminal, respectively. The delay circuit 15 outputs the phase signals DS4, DS8 from the Q terminal and the Q terminal, respectively.

In other words, the four delay circuits 12 to 15 output a multi-phase signal of eight phases, that is, eight phase signals DS1 to DS8. The eight phase signals DS1 to DS8 each has a frequency of fc/3. The eight phase signals DS1 to DS8 have different phases from each other, and the phase difference with the phase signal having the closest phase is equal at substantially $2\pi/8=\pi/4$.

Figure 3:
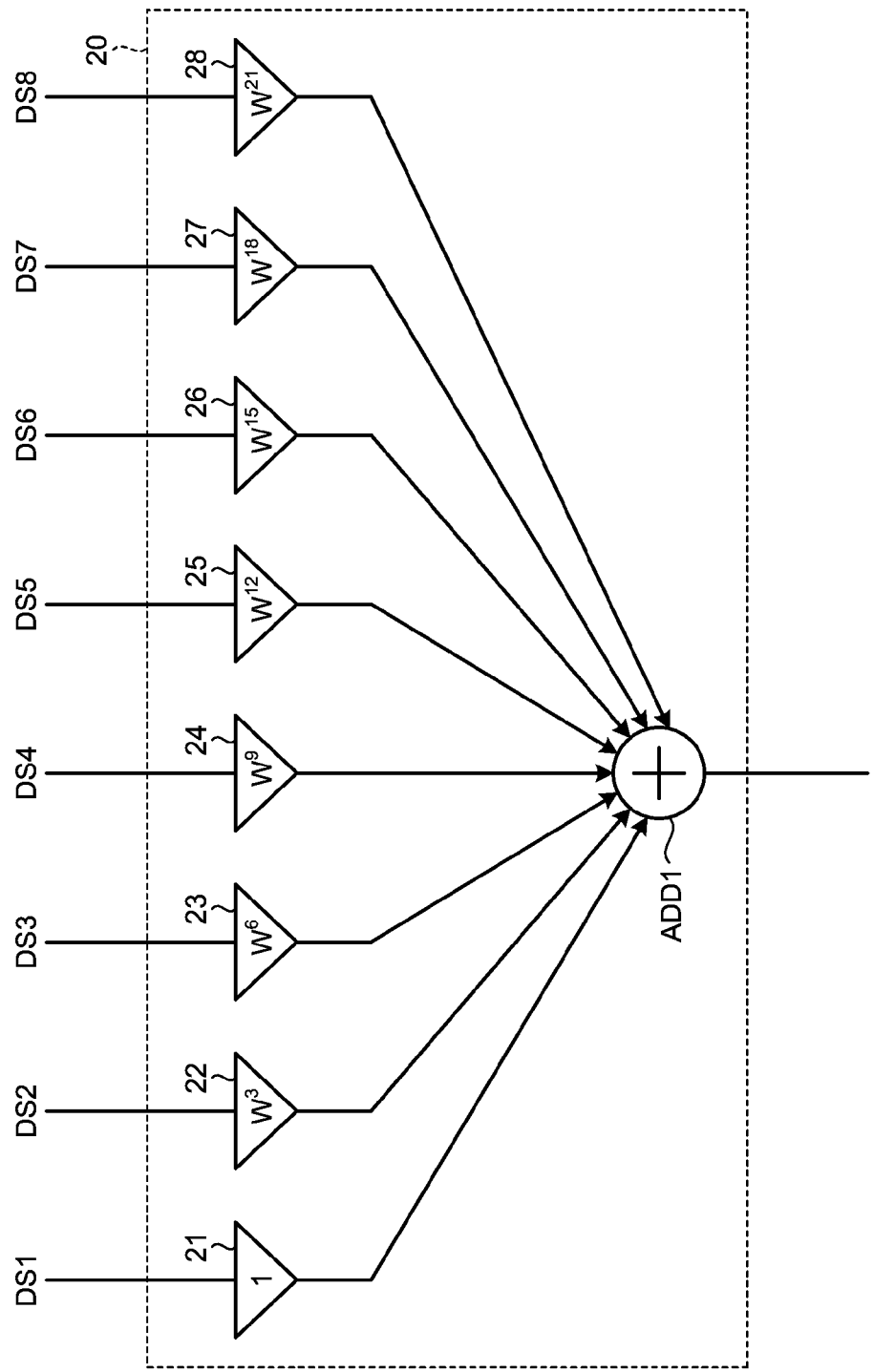
FIG. 3 is a view illustrating a configuration of an adjustment circuit according to the first embodiment.

The configuration of the adjustment circuit 20 will now be described using FIG. 3. FIG. 3 is a view illustrating a configuration of the adjustment circuit 20.

The adjustment circuit 20 includes K amplifiers 21 to 28, and an adder ADD1. The K amplifiers 21 to 28 correspond to K phase signals, and each receives the corresponding phase signal. The K amplifiers 21 to 28 amplify the phase signal at fixed gains different from each other. The fixed gain is a real part or an imaginary part of $w^{3N}$ (N=0, 1, 2, ..., K−1), where w is the weight of Fourier transformation. For example, if the real part is used for the fractional frequency dividing circuit 100-I of the LO-I signal, the imaginary part is used for the fractional frequency dividing circuit 100-Q of the LO-Q signal. The weight of the Fourier transformation is, for example, $w=\exp(2\pi j/K)$ where j is the imaginary number unit.

In other words, the K amplifiers 21 to 28 are connected in parallel with respect to the adder ADD1 in the adjustment circuit 20. The K amplifiers 21 to 28 receive the K phase signals in parallel, amplify the received phase signals at the fixed gain "real part or imaginary part of $w^{3N}$" and provides the same to the adder ADD1. The adder ADD1 adds the amplified K phase signals, and outputs the addition result as the fractional-frequency-divided signal. The FIR filter capable of adjusting the waveform of the signal so as to approach the sine wave while frequency-multiplying by m times is thereby configured.

In FIG. 3, a case in which m=3, n=4, and K=2n=8 is illustrated. In FIG. 3, the eight amplifiers 21 to 28 are connected in parallel on the input side of the adder ADD1 to configure the FIR filter.

In other words, the amplifier 21 receives the phase signal DS1, amplifies the phase signal DS1 at the gain of "real part or imaginary part of $w^0=1$" and provides the same to the adder ADD1. The amplifier 22 receives the phase signal DS2, amplifies the phase signal DS2 at the gain of "real part or imaginary part of $w^3$", and provides the same to the adder ADD1. The amplifier 23 receives the phase signal DS3, amplifies the phase signal DS3 at the gain of "real part or imaginary part of $w^6$", and provides the same to the adder ADD1. The amplifier 24 receives the phase signal DS4, amplifies the phase signal DS4 at the gain of "real part or imaginary part of $w^9$", and provides the same to the adder ADD1. The amplifier 25 receives the phase signal DS5, amplifies the phase signal DS5 at the gain of "real part or imaginary part of $w^{12}$", and provides the same to the adder ADD1. The amplifier 26 receives the phase signal DS6, amplifies the phase signal DS6 at the gain of "real part or imaginary part of $w^{15}$", and provides the same to the adder ADD1. The amplifier 27 receives the phase signal DS7, amplifies the phase signal DS7 at the gain of "real part or imaginary part of $w^{18}$", and provides the same to the adder ADD1. The amplifier 28 receives the phase signal DS8, amplifies the phase signal DS8 at the gain of "real part or imaginary part of $w^{21}$", and provides the same to the adder ADD1. The adder ADD1 adds the amplified phase signals DS1 to DS8, and outputs the addition result as the fractional-frequency-divided signal. The fractional-frequency-divided signal has a frequency of fc.

Figure 4:
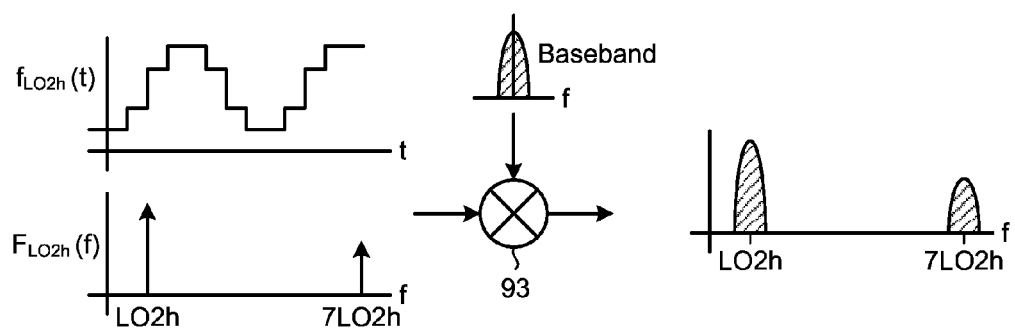
FIG. 4 is a view illustrating an operation of the fractional frequency dividing circuit according to the first embodiment.

The operation of the fractional frequency dividing circuit 100 will now be described using FIG. 4. FIG. 4 is a view illustrating an operation of the fractional frequency dividing circuit 100.

In the fractional frequency dividing circuit 100, the output waveform becomes a stair-like waveform close to a sine wave due to the weighting-addition in the adjustment circuit 20, and the unnecessary tones 3LO2h, 5LO2h are suppressed, for example, compared to the basic mode (FIG. 26) as illustrated on the lower left diagram of FIG. 4. Therefore, if the fractional-frequency-divided signal is used directly as the local signals LO-I, LO-Q and modulation is carried out in the mixer 93, also in the signal after the modulation, the unnecessary tones 3LO2h, 5LO2h are suppressed, as illustrated in the right diagram of FIG. 4.

It should be noted that, although a case where 3LO2h and 5LO2h are the unnecessary tones has been exemplified, the desired output tone can be changed to 3LO2h or to 5LO2h with selecting the adequate weighting coefficients of the adjustment circuit 20.

As described above, according to the first embodiment, the integral frequency dividing circuit 10 converts the reference signal to K (K is a positive integer) phase signals each having a frequency of one nth (n is a positive integer) of the reference signal and having different phases from each other in the fractional frequency dividing circuit 100. The adjustment circuit 20 weighting-adds the K phase signals, and generates the fractional-frequency-divided signals having a frequency of m times (m is a positive integer that is not the multiples of n) each of the K phase signals. Thus, it can function as the FIR filter capable of suppressing the unnecessary tones of the fractional-frequency-divided signal to be generated while frequency-multiplying by m times the K phase signals in the adjustment circuit 20, so that the unnecessary tones can be reduced with a simple configuration without using the parallel LC resonance circuit.

Therefore, the chip area of the fractional frequency dividing circuit can be reduced and the transmitter TR can be miniaturized compared to the basic mode. Furthermore, the adjustment mechanism of the resonance frequency is also unnecessary since the parallel LC resonance circuit is not used, whereby the configuration of the fractional frequency dividing circuit is easily simplified and the configuration of the transmitter TR is easily simplified. The manufacturing cost of the transmitter TR thus can be reduced.

In the first embodiment, K/2 delay circuits 12 to 15 transfer signals in synchronization with the reference signal and output two signals, which phases are inverted from each other, in the integral frequency dividing circuit 10 of the fractional frequency dividing circuit 100. In the adjustment circuit 20, the K amplifiers 21 to 28 amplify the K phase signals at fixed gains different from each other. The adder ADD1 adds the amplified K phase signals, and outputs the addition result as the fractional-frequency-divided signal. In other words, in the fractional frequency dividing circuit 100, the signal (square wave signal) corresponding to the reference signal is used as a clock, and the frequency characteristics are determined according to the ratio of the clock and the gain of the plurality of signal paths, and thus the frequency characteristics can be determined in accordance with the frequency of the reference signal.

Therefore, compared to the basic mode in which the values of L and C need to be adjusted when the frequency of the reference signal is changed, such adjustment is not necessary and hence the changes of the reference signal can be easily responded according to the first embodiment.

Furthermore, in the first embodiment, the fixed gain is the real part or the imaginary part of $w^{3N}$ (N=0, 1, 2, ..., K−1), where w is the weight of the Fourier transformation in the adjustment circuit 20. Thus, the K phase signals are weighting-added in the adjustment circuit 20, and the waveform of the signal can be adjusted to approach a sine wave while frequency-multiplying by m times each of the K phase signals. For example, the adjustment circuit 20 adjusts the waveform of the signal to a waveform of stair-like form (see upper left diagram of FIG. 4) in correspondence with the sine wave while frequency-multiplying by m times each of the K phase signals.

It should be noted that, although in FIG. 1 to FIG. 3, a case of m=3, n=4 is illustrated, m and n are not limited to such values. For example, m=5 and n=4 may be adopted. Alternatively, for example, m=3 and n=8 may be adopted. Alternatively, for example, m=5 and n=8 may be adopted. Alternatively, for example, m=2 and n=3 may be adopted. Alternatively, for example, m=4 and n=3 may be adopted. Alternatively, for example, m=5 and n=3 may be adopted.

Second Embodiment

A fractional frequency dividing circuit 200 according to a second embodiment will now be described. Hereinafter, the portion different from the first embodiment will be centrally described.

In the first embodiment, K phase signals are directly weighting-added, but in the second embodiment, phase signals are interpolated between the K phase signals to increase the number of phases, and then weighting-added.

Figure 5:
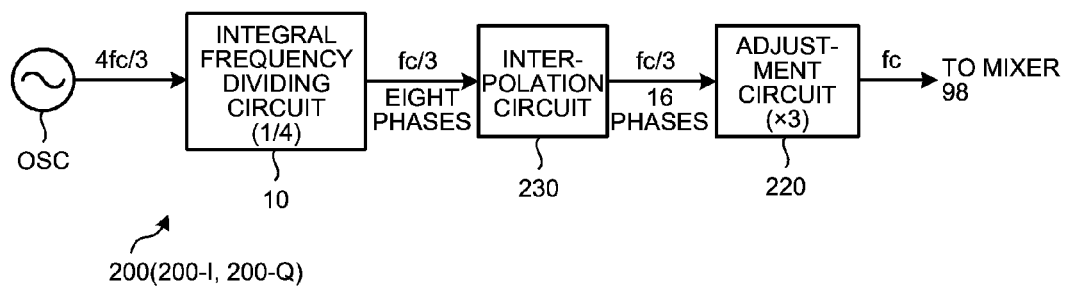
FIG. 5 is a view illustrating a fractional frequency dividing circuit according to a second embodiment.

Specifically, as illustrated in FIG. 5, the fractional frequency dividing circuit 200 further includes an interpolation circuit 230, and includes an adjustment circuit 220 in place of the adjustment circuit 20 (see FIG. 1). FIG. 5 is a view illustrating a configuration of the fractional frequency dividing circuit 200.

The interpolation circuit 230 receives K phase signals from the integral frequency dividing circuit 10. The interpolation circuit 230 interpolates phase signals between the K phase signals, and generates P phase signals having different phases from each other. P is an integer greater than K. For example, P=2K. The P phase signals each has a frequency of one nth of the reference signal. The P phase signals each has a frequency of n×fc/m×1/n=fc/m. The P phase signals have different phases from each other. Among the P phase signals, a phase difference with the phase signal having the closest phase is equal (e.g., $2\pi/P=\pi/K$).

For example, in the case of m=3, n=4, the interpolation circuit 230 receives the multi-phase signal of eight phases, that is, eight phase signals from the integral frequency dividing circuit 10. The interpolation circuit 230 interpolates the eight phase signals to generate a multi-phase signal of 16 phases, that is, 16 phase signals. The 16 phase signals each has a frequency of fc/3. The 16 phase signals have different phases from each other, and the phase difference with the phase signal having the closest phase is equal at substantially $2\pi/16=\pi/8$.

The interpolation circuit 230 outputs the generated P phase signals to the adjustment circuit 220. For example, in the case of m=3, n=4, the interpolation circuit 230 outputs a multi-phase signal of 16 phases, that is, 16 phase signals to the adjustment circuit 220.

The adjustment circuit 220 weighting-adds the P phase signals to generate a fractional-frequency-divided signal. For example, in the case of m=3, n=4, the adjustment circuit 220 weighting-adds the 16 phase signals to generate the fractional-frequency-divided signal.

Figure 6:
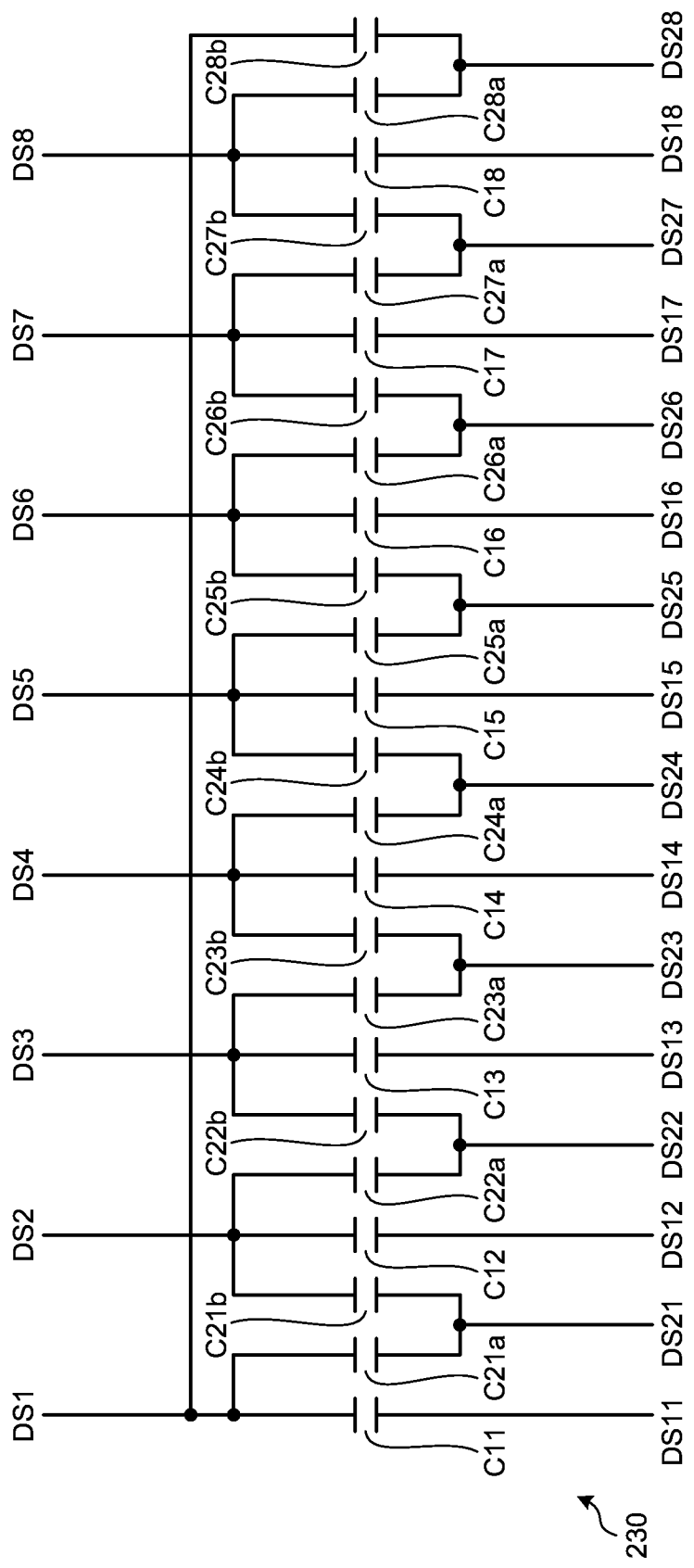
FIG. 6 is a view illustrating a configuration of an interpolation circuit according to the second embodiment.
Figure 7:
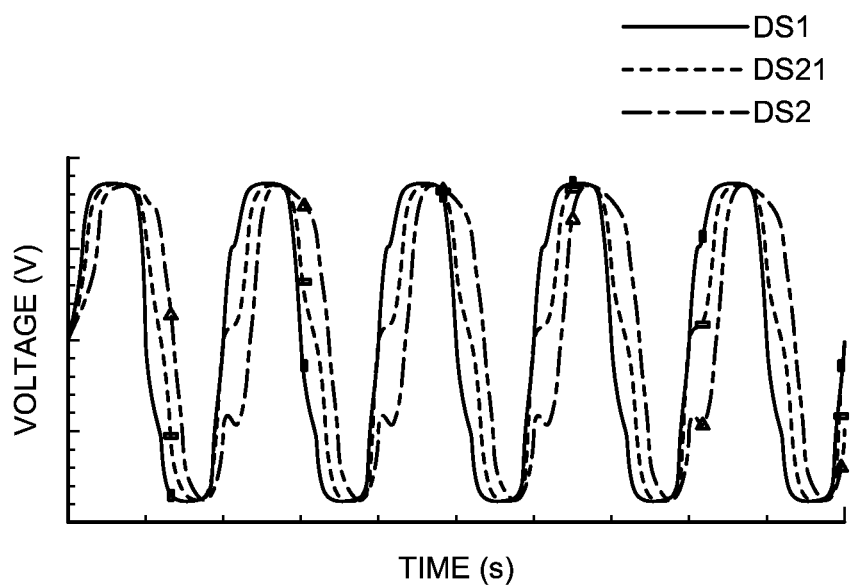
FIG. 7 is a view illustrating an operation of the interpolation circuit according to the second embodiment.

The interpolation circuit 230 will now be described using FIG. 6 and FIG. 7. FIG. 6 is a view illustrating a configuration of the interpolation circuit 230. FIG. 7 is a view illustrating an operation of the interpolation circuit 230.

The interpolation circuit 230 includes K capacitors C11 to C18 and K pairs of capacitors C21a, C21b to C28a, and C28b. In the interpolation circuit 230, K capacitors C11 to C18 and K pairs of capacitors C21a, C21b to C28a, and C28b are connected in parallel between the input side (upper side in FIG. 6) and the output side (lower side in FIG. 6).

The K capacitors C11 to C18 correspond to K phase signals, and each receives the corresponding phase signal at one end. The K capacitors C11 to C18 each transmits the received phase signal to the other end side. In other words, the K capacitors C11 to C18 output K phase signals corresponding to the received K phase signals.

The K pairs of capacitors C21a, C21b to C28a, and C28b correspond to two phase signals having the closest phases among the K phase signals. Each pair of capacitors receives the corresponding two phase signals on one end side. Each pair of capacitors averages the received two phase signals, generates the phase signal having a phase between the two phase signals, and transmits the same to the other end side (see FIG. 7). In other words, the K pairs of capacitors C21a, C21b to C28a, and C28b interpolate a phase signal between the two phase signals having the closest phases among the K phase signals, and output the K phase signals as the interpolation result.

In FIG. 6, a case in which m=3, n=4, K=2n=8, and P=2K=16 is illustrated. In FIG. 6, eight capacitors C11 to C18 and eight groups of capacitors C21a, C21b to C28a, C28b are connected in parallel between the input side (upper side in FIG. 6) and the output side (lower side in FIG. 6).

The capacitor C11 transmits the phase signal DS1 received at one end side to the other end side as the phase signal DS11. The capacitor C12 transmits the phase signal DS2 received at one end side to the other end side as the phase signal DS12. The capacitor C13 transmits the phase signal DS3 received at one end side to the other end side as the phase signal DS13. The capacitor C14 transmits the phase signal DS4 received at one end side to the other end side as the phase signal DS14. The capacitor C15 transmits the phase signal DS5 received at one end side to the other end side as the phase signal DS15. The capacitor C16 transmits the phase signal DS6 received at one end side to the other end side as the phase signal DS16. The capacitor C17 transmits the phase signal DS7 received at one end side to the other end side as the phase signal DS17. The capacitor C18 transmits the phase signal DS8 received at one end side to the other end side as the phase signal DS18.

A pair of capacitors C21a, C21b averages the two phase signals DS1, DS2 received at one end side, generates the phase signal DS21 having a phase between the two phase signals DS1, DS2, and transmits the same to the other end side (see FIG. 7). A pair of capacitors C22a, C22b averages the two phase signals DS2, DS3 received at one end side, generates the phase signal DS22 having a phase between the two phase signals DS2, DS3, and transmits the same to the other end side. A pair of capacitors C23a, C23b averages the two phase signals DS3, DS4 received at one end side, generates the phase signal DS23 having a phase between the two phase signals DS3, DS4, and transmits the same to the other end side. A pair of capacitors C24a, C24b averages the two phase signals DS4, DS5 received at one end side, generates the phase signal DS24 having a phase between the two phase signals DS4, DS5, and transmits the same to the other end side. A pair of capacitors C25a, C25b averages the two phase signals DS5, DS6 received at one end side, generates the phase signal DS25 having a phase between the two phase signals DS5, DS6, and transmits the same to the other end side. A pair of capacitors C26a, C26b averages the two phase signals DS6, DS7 received at one end side, generates the phase signal DS26 having a phase between the two phase signals DS6, DS7, and transmits the same to the other end side. A pair of capacitors C27a, C27b averages the two phase signals DS7, DS8 received at one end side, generates the phase signal DS27 having a phase between the two phase signals DS7, DS8, and transmits the same to the other end side. A pair of capacitors C28a, C28b averages the two phase signals DS8, DS1 received at one end side, generates the phase signal DS28 having a phase between the two phase signals DS8, DS1, and transmits the same to the other end side.

In other words, the interpolation circuit 230 outputs a multi-phase signal of 16 phases, that is, 16 phase signals DS11 to DS18, and DS21 to DS28. The 16 phase signals DS11 to DS18, DS21 to DS28 each has a frequency of fc/3. The 16 phase signals DS11 to DS18, DS21 to DS28 have different phases from each other, and the phase difference with the phase signal having the closest phase is equal at substantially $2\pi/16=\pi/8$.

Figure 8:
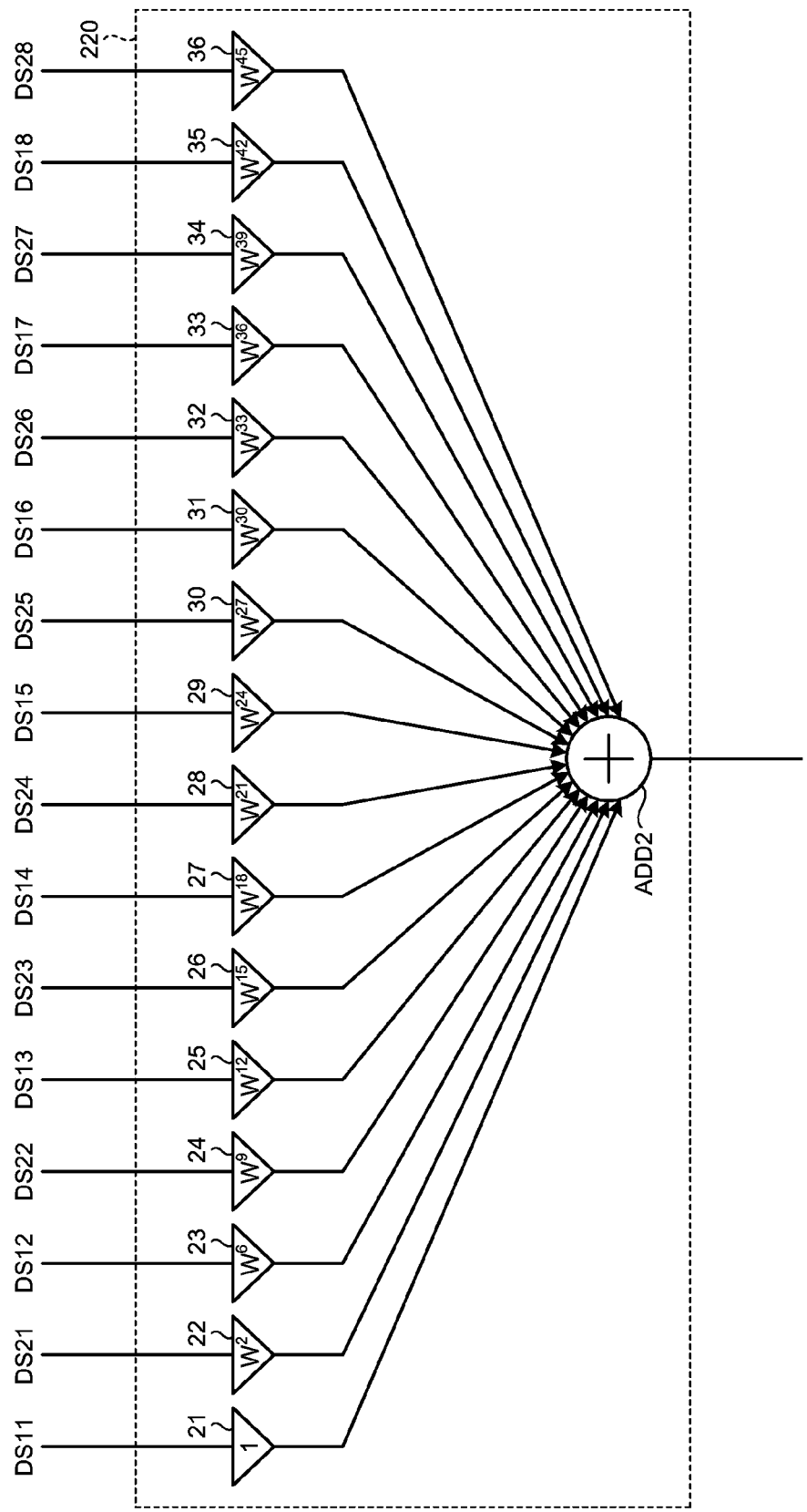
FIG. 8 is a view illustrating a configuration of an adjustment circuit according to the second embodiment.

The configuration of the adjustment circuit 220 will now be described using FIG. 8. FIG. 8 is a view illustrating a configuration of the adjustment circuit 220.

The adjustment circuit 220 includes P amplifiers 21 to 36, and an adder ADD2. The P amplifiers 21 to 36 correspond to P phase signals, and each receives the corresponding phase signal. The P amplifiers 21 to 36 amplify the phase signal at fixed gains different from each other. The fixed gain is a real part or an imaginary part of $w^{3N}$ (N=0, 1, 2, ..., P−1), where w is the weight of Fourier transformation. The weight of the Fourier transformation is, for example, $w=\exp(2\pi j/P)$ where j is the imaginary number unit.

In other words, the P amplifiers 21 to 36 are connected in parallel with respect to the adder ADD2 in the adjustment circuit 220. The P amplifiers 21 to 36 receive the P phase signals in parallel, amplify the received phase signals at the fixed gain "real part or imaginary part of $w^{3N}$" and provide the same to the adder ADD2. The adder ADD2 adds the amplified P phase signals, and outputs the addition result as the fractional-frequency-divided signal. The FIR filter capable of adjusting the waveform of the signal so as to approach the sine wave while frequency-multiplying by m times is thereby configured.

In FIG. 8, a case in which m=3, n=4, K=2n=8, and P=2K=16 is illustrated. In FIG. 8, the 16 amplifiers 21 to 36 are connected in parallel on the input side of the adder ADD2 to configure the FIR filter.

For example, the amplifier 29 receives the phase signal DS15, amplifies the phase signal DS15 at the gain of "real part or imaginary part of $w^{24}$", and provides the same to the adder ADD2. For example, the amplifier 30 receives the phase signal DS25, amplifies the phase signal DS25 at the gain of "real part or imaginary part of $w^{27}$", and provides the same to the adder ADD2. The amplifier 31 receives the phase signal DS16, amplifies the phase signal DS16 at the gain of "real part or imaginary part of $w^{30}$", and provides the same to the adder ADD2. The amplifier 32 receives the phase signal DS26, amplifies the phase signal DS26 at the gain of "real part or imaginary part of $w^{33}$", and provides the same to the adder ADD2. The amplifier 33 receives the phase signal DS17, amplifies the phase signal DS17 at the gain of "real part or imaginary part of $w^{36}$", and provides the same to the adder ADD2. The amplifier 34 receives the phase signal DS27, amplifies the phase signal DS27 at the gain of "real part or imaginary part of $w^{39}$", and provides the same to the adder ADD2. The amplifier 35 receives the phase signal DS18, amplifies the phase signal DS18 at the gain of "real part or imaginary part of $w^{42}$", and provides the same to the adder ADD2. The amplifier 36 receives the phase signal DS28, amplifies the phase signal DS28 at the gain of "real part or imaginary part of $w^{45}$", and provides the same to the adder ADD2. The adder ADD2 adds the amplified phase signals DS11 to DS28, and outputs the addition result as the fractional-frequency-divided signal. The fractional-frequency-divided signal has a frequency of fc.

As described above, in the second embodiment, the interpolation circuit 230 interpolates phase signals between the K phase signals output from the integral frequency dividing circuit 10, generates P (P is an integer greater than K) phase signals having different phases from each other, and provides the same to the adjustment circuit 220 in the fractional frequency dividing circuit 200. The adjustment circuit 220 weighting-adds the P phase signals to generate a fractional-frequency-divided signal. Thus, in the adjustment circuit 220, the phase signals of greater number of phases than the first embodiment can be weighting-added, so that the waveform of the signal can be adjusted to be closer to the sine wave. For example, the adjustment circuit 220 can make the width of the stair narrower and increase the number of steps in the stair when adjusting the waveform of the signal to a stair-like waveform (see upper left diagram of FIG. 4) in correspondence with the sine wave.

In other words, since the signal (square wave signal) corresponding to the reference signal is used as a clock, if the number of phases is doubled, for example, the number of rising edges and falling edges of the clock per unit time equivalently doubles thus obtaining effects similar to when the clock frequency is doubled, and the frequency that can be removed with the FIR filter (adjustment circuit 220) can be enlarged to two times. The type of unnecessary tones that can be removed thus can be increased. For example, the unnecessary tone 7LO2h (see lower left diagram of FIG. 4) can be further suppressed.

Furthermore, in the second embodiment, K pairs of capacitors C21a, C21b to C28a, C28b interpolate a phase signal between the two phase signals having the closest phases of the K phase signals and provide to the adjustment circuit 220 in the interpolation circuit 230 of the fractional frequency dividing circuit 200. Each of the K capacitors C11 to C18 receives the corresponding phase signal of the K phase signals, and provides the K phase signals corresponding to the received K phase signals to the adjustment circuit 220. In other words, the interpolation circuit 230 provides K+K=2K=P phase signals to the adjustment circuit 220. In the adjustment circuit 220, the P amplifiers 21 to 36 amplify the P phase signals at fixed gains different from each other. Thus, the number of phases of the phase signals to be weighting-added can be increased and the accuracy of waveform shaping can be enhanced with a simple configuration.

Furthermore, in the second embodiment, the fixed gain is the real part or the imaginary part of $w^{3N}$ (N=0, 1, 2, ..., P−1), where w is the weight of the Fourier transformation in the adjustment circuit 220. Thus, P, which is greater than K, phase signals can be weighting-added in the adjustment circuit 220.

Figure 9:
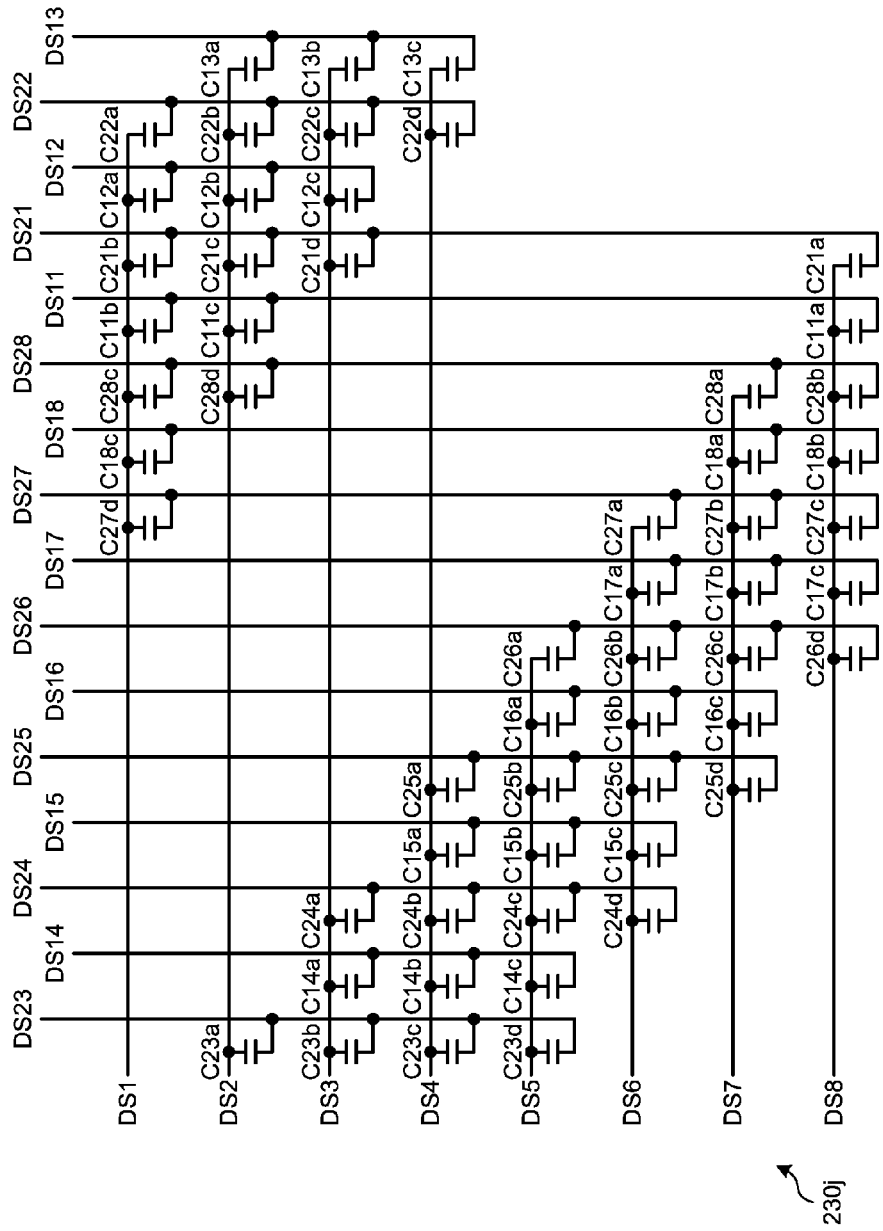
FIG. 9 is a view illustrating a configuration of an interpolation circuit according to a variant of the second embodiment.
Figure 10:
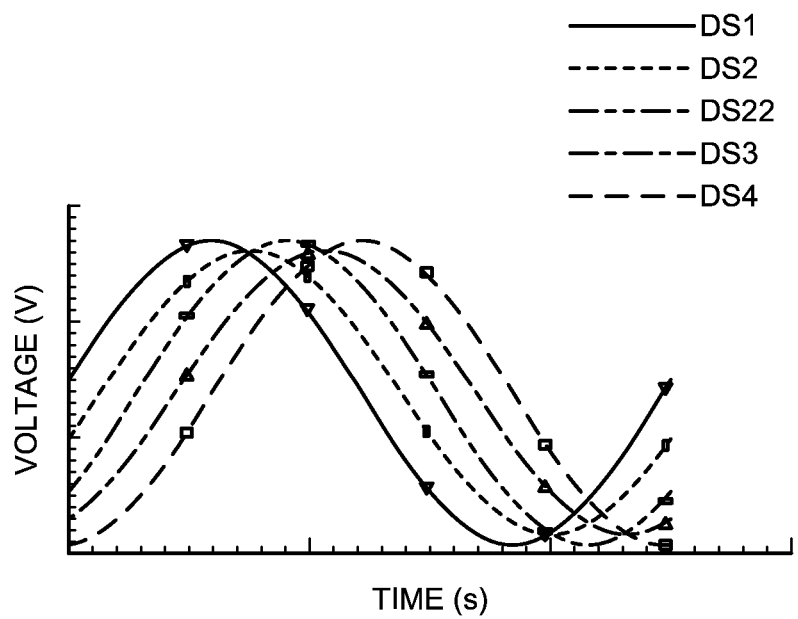
FIG. 10 is a view illustrating an operation of the interpolation circuit according to the variant of the second embodiment.

It should be noted that, as illustrated in FIG. 9 and FIG. 10, the interpolation circuit 230j may perform interpolation by the weighting-addition. FIG. 9 is a view illustrating a configuration of the interpolation circuit 230j. FIG. 10 is a view illustrating an operation of the interpolation circuit 230j.

The interpolation circuit 230j includes K groups of capacitors C11a, C11b, C11c to C18a, C18b, C18c and K groups of capacitors C21a, C21b, C21c, C21d to C28a, C28b, C28c, C28d. In the interpolation circuit 230j, K groups of capacitors C11a, C11b, C11c to C18a, C18b, C18c and K groups of capacitors C21a, C21b, C21c, C21d to C28a, C28b, C28c, C28d are connected in parallel between the input side (left side in FIG. 9) and the output side (upper side in FIG. 9).

The K groups of capacitors C11a, C11b, C11c to C18a, C18b, C18c correspond to K phase signals, and each receives the corresponding phase signal at one end side. In this case, the K groups of capacitors C11a, C11b, C11c to C18a, C18b, C18c also receive the phase signals on both sides having the closest phase to the relevant phase signal at one end side in addition to the corresponding phase signal to approach the properties of the K groups of capacitors C21a, C21b, C21c, C21d to C28a, C28b, C28c, C28d. Each of the K groups of capacitors C11a, C11b, C11c to C18a, C18b, C18c averages the received phase signal and the phase signals on both sides, and transmits the received phase signal to the other end side while fine tuning taking also into consideration the phase signals on both sides. In other words, the K groups of capacitors C11a, C11b, C11c to C18a, C18b, C18c output K phase signals corresponding to the received K phase signals.

The K groups of capacitors C21a, C21b, C21c, C21d to C28a, C28b, C28c, C28d correspond to two phase signals having the closest phases among the K phase signals. The capacitor of each group receives the corresponding two phase signals on one end side. In this case, the capacitor of each group also receives, in addition to the two phase signals, the phase signals on both sides having the next closest phases with respect to the two phase signals. The capacitor of each pair averages the received two phase signals and the phase signals on both sides, generates the phase signal having a phase between the two phase signals while fine tuning taking also into consideration the phase signals on both sides, and transmits the same to the other end side (see FIG. 10). In other words, the K pairs of capacitors C21a, C21b to C28a, and C28b interpolate a phase signal between the two phase signals having the closest phases among the K phase signals, and output the K phase signals as the interpolation result.

In FIG. 9, a case in which m=3, n=4, K=2n=8, and P=2K=16 is illustrated. In FIG. 9, eight groups of capacitors C11a, C11b, C11c to C18a, C18b, C18c, and eight groups of capacitors C21a, C21b, C21c, C21d to C28a, C28b, C28c, C28d are connected in parallel between the input side (left side in FIG. 9) and the output side (upper side in FIG. 9).

One group of capacitors C11a to C11c averages the phase signal DS1 and the phase signals DS8, DS2 on both sides received at one end side, generates the phase signal DS11 in which the phase of the phase signal DS1 is fine-tuned, and transmits the same to the other end side. One group of capacitors C12a to C12c averages the phase signal DS2 and the phase signals DS1, DS3 on both sides received at one end side, generates the phase signal DS12 in which the phase of the phase signal DS2 is fine-tuned, and transmits the same to the other end side. One group of capacitors C13a to C13c averages the phase signal DS3 and the phase signals DS2, DS4 on both sides received at one end side, generates the phase signal DS13 in which the phase of the phase signal DS3 is fine-tuned, and transmits the same to the other end side. One group of capacitors C14a to C14c averages the phase signal DS4 and the phase signals DS3, DS5 on both sides received at one end side, generates the phase signal DS14 in which the phase of the phase signal DS4 is fine-tuned, and transmits the same to the other end side. One group of capacitors C15a to C15c averages the phase signal DS5 and the phase signals DS4, DS6 on both sides received at one end side, generates the phase signal DS15 in which the phase of the phase signal DS5 is fine-tuned, and transmits the same to the other end side. One group of capacitors C16a to C16c averages the phase signal DS6 and the phase signals DS5, DS7 on both sides received at one end side, generates the phase signal DS16 in which the phase of the phase signal DS6 is fine-tuned, and transmits the same to the other end side. One group of capacitors C17a to C17c averages the phase signal DS7 and the phase signals DS6, DS8 on both sides received at one end side, generates the phase signal DS17 in which the phase of the phase signal DS7 is fine-tuned, and transmits the same to the other end side. One group of capacitors C18a to C18c averages the phase signal DS8 and the phase signals DS7, DS1 of both sides received at one end side, generates the phase signal DS18 in which the phase of the phase signal DS8 is fine-tuned, and transmits the same to the other end side.

One group of capacitors C21a to C21d averages the two phase signals DS1, DS2 and the phase signals DS8, DS3 on both sides received at one end side, generates the phase signal DS21 having a phase between the two phase signals DS1, DS2, and transmits the same to the other end side. One group of capacitors C22a to C22d averages the two phase signals DS2, DS3 and the phase signals DS1, DS4 on both sides received at one end side, generates the phase signal DS22 having a phase between the two phase signals DS2, DS3, and transmits the same to the other end side (see FIG. 10). One group of capacitors C23a to C23d averages the two phase signals DS3, DS4 and the phase signals DS2, DS5 on both sides received at one end side, generates the phase signal DS23 having a phase between the two phase signals DS3, DS4, and transmits the same to the other end side. One group of capacitors C24a to C24d averages the two phase signals DS4, DS5 and the phase signals DS3, DS6 on both sides received at one end side, generates the phase signal DS24 having a phase between the two phase signals DS4, DS5, and transmits the same to the other end side. One group of capacitors C25a to C25d averages the two phase signals DS5, DS6 and the phase signals DS4, DS7 on both sides received at one end side, generates the phase signal DS25 having a phase between the two phase signals DS5, DS6, and transmits the same to the other end side. One group of capacitors C26a to C26d averages the two phase signals DS6, DS7 and the phase signals DS5, DS8 on both sides received at one end side, generates the phase signal DS26 having a phase between the two phase signals DS6, DS7, and transmits the same to the other end side. One group of capacitors C27a to C27d averages the two phase signals DS7, DS8 and the phase signals DS6, DS1 on both sides received at one end side, generates the phase signal DS27 having a phase between the two phase signals DS7, DS8, and transmits the same to the other end side. One group of capacitors C28a to C28d averages the two phase signals DS8, DS1 and the phase signals DS7, DS2 on both sides received at one end side, generates the phase signal DS28 having a phase between the two phase signals DS8, DS1, and transmits the same to the other end side.

Thus, the interpolation by weighting-addition is carried out in the interpolation circuit 230j, so that the phase signal between the two phase signals having the closest phases of the K phase signals can be smoothly interpolated while also taking into consideration the phases on both sides.

Third Embodiment

A fractional frequency dividing circuit 300 according to a third embodiment will now be described. Hereinafter, the portion different from the first embodiment will be centrally described.

The weighting of when performing the weighting-addition is set with the gain of the amplifier in the first embodiment, but the weighting of when performing the weighting-addition is set with the dimension (=W/L, W: channel width, L: channel length) of the transistor in the third embodiment.

Figure 11:
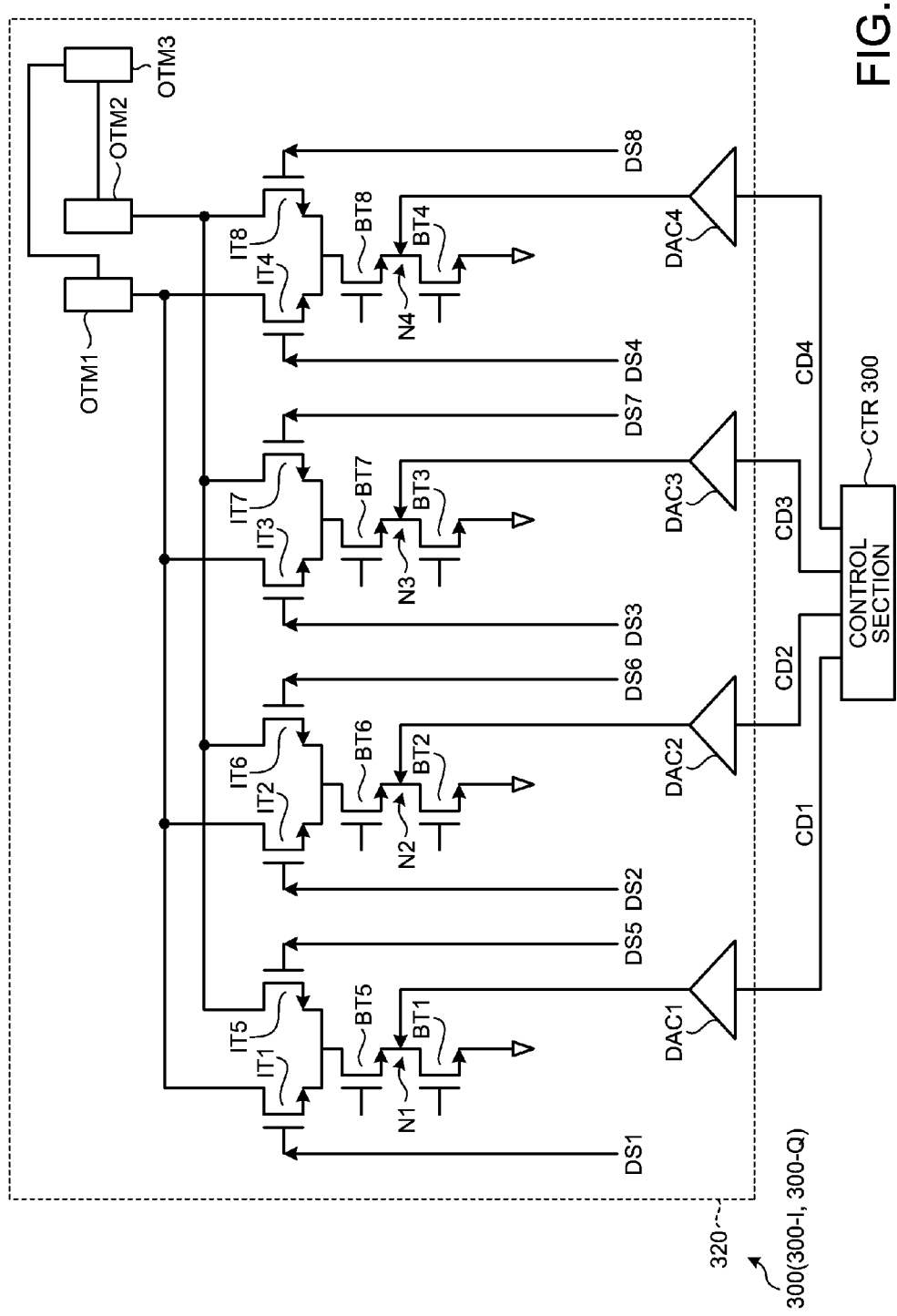
FIG. 11 is a view illustrating a configuration of an adjustment circuit according to a third embodiment.

Specifically, the fractional frequency dividing circuit 300 includes an adjustment circuit 320 illustrated in FIG. 11 in place of the adjustment circuit 20 illustrated in FIG. 3. The adjustment circuit 320 includes a plurality of a bias transistors BT1 to BT8, a plurality of input transistors IT1 to IT8, DA converters DAC1 to DAC4, and output terminals OTM1 to OTM3. FIG. 11 is a view illustrating a configuration of the adjustment circuit 320.

The plurality of bias transistors BT1 to BT8 are arranged on the source side with respect to the plurality of input transistors IT1 to IT8. The plurality of bias transistors BT1 to BT4 are supplied to the gate with a bias (e.g., fixed bias) common to each other, and respectively function as the constant current source. The plurality of bias transistors BT5 to BT8 are supplied to the gate with a bias (e.g., fixed bias) common to each other, and respectively function as the constant current source.

The plurality of input transistors IT1 to IT8 have dimensions (=W/L) different from each other in correspondence with a plurality of signals to be weighting-added. The K input transistors IT1 to IT8 correspond to the K phase signals, and each receives the corresponding phase signal at the gate. The K input transistors IT1 to IT8 amplify the phase signals received at the gate with the fixed gains different from each other. The fixed gain is a real part or an imaginary part of $w^{3N}$ (N=0, 1, 2, . . . , K−1), where w is the weight of Fourier transformation. The weight of the Fourier transformation is, for example, $w=\exp(2\pi j/K)$ where j is the imaginary number unit. In other words, the dimensions of the K input transistors IT1 to IT8 are values corresponding to the fixed gain, and for example, are values proportional to the real part or the imaginary part of $w^{3N}$ (N=0, 1, 2, . . . , K−1).

In FIG. 11, a case in which m=3, n=4, and K=2n=8 is illustrated. In FIG. 3, the eight input transistors IT1 to IT8 are connected in parallel with respect to the output terminals OTM1 to OTM3 to configure the FIR filter. For example, the relationship of the following equation 1 is satisfied assuming the dimensions of the input transistors IT1 to IT8 as $W_1/L_1$ to $W_8/L_8$. In the mathematical equation 1, $Re(w^{3N})$ represents the real part of $w^{3N}$.

$$W_1/L_1:W_2/L_2:W_3/L_3:W_4/L_4:W_5/L_5:W_6/L_6:W_7/L_7:W_8/L_8 = Re)(w^0):Re(w^3):Re(w^6):Re(w^9):Re(w^{12}):Re(w^{15}):Re(w^{18}):Re(w^{21})$$  Equation 1

It should be noted that the dimension of the eight input transistors IT1 to IT8 may be adjusted to satisfy equation 1 by changing the channel width with the channel length made common ($L_1=L_2=$ . . . $=L_8$). Alternatively, the dimension of the eight input transistors IT1 to IT8 may be adjusted to satisfy equation 1 by changing the channel length with the channel width made common (($W_1=W_2=$ . . . $=W_8$). Alternatively, the dimension of the eight input transistors IT1 to IT8 may be adjusted to satisfy equation 1 by changing both the channel width and the channel length.

In this case, the dimension of the plurality of input transistors IT1 to IT8 sometimes deviate from that indicated in equation 1 due to the manufacturing variation, and the like of the plurality of input transistors IT1 to IT8.

The DA converters DAC1 to DAC4 supply the correction current to the corresponding transistor so as to correct the shift in the drain current value caused by the shift in the dimension of the plurality of input transistors IT1 to IT8.

It should be noted that the shift in the drain current value caused by the shift in the dimension of each input transistor IT1 to IT8 can be obtained by measuring the properties of each input transistor IT1 to IT8 after manufacturing and before shipping of the fractional frequency dividing circuit 300. The control section CTR 300 is set with correction data CD1 to CD4 corresponding to the measurement result. Thus, the control section CTR 300 provides the correction data CD1 to CD4 to the DA converters DAC1 to DAC4 after the shipment of the fractional frequency dividing circuit 300. The DA converters DAC1 to DAC4 D/A convert the correction data CD1 to CD4, and supply the correction current to the corresponding transistor.

The DA converter DAC1 supplies the correction current to the source side of the input transistors IT1, IT5. For example, the DA converter DAC1 supplies the correction current to a node N1 between the bias transistor BT1 and the bias transistor BT5.

The DA converter DAC2 supplies the correction current to the source side of the input transistors IT2, IT6. For example, the DA converter DAC2 supplies the correction current to a node N2 between the bias transistor BT2 and the bias transistor BT6.

The DA converter DAC3 supplies the correction current to the source side of the input transistors IT3, IT7. For example, the DA converter DAC3 supplies the correction current to a node N3 between the bias transistor BT3 and the bias transistor BT7.

The DA converter DAC4 supplies the correction current to the source side of the input transistors IT4, IT8. For example, the DA converter DAC4 supplies the correction current to a node N4 between the bias transistor BT4 and the bias transistor BT8.

At the output terminals OTM1 to OTM3, the signal amplified by the plurality of input transistors IT1 to IT8, that is, the drain currents of the plurality of input transistors IT1 to IT8 are added. For example, the output terminal OTM1 is connected to the drain side of the input transistors IT1 to IT4, and the drain currents generated by the input transistors IT1 to IT4 according to the phase signals DS1 to DS4 are added. For example, the output terminal OTM2 is connected to the drain side of the input transistors IT5 to IT8, and the drain currents generated by the input transistors IT5 to IT8 according to the phase signals DS5 to DS8 are added. For example, the output terminal OTM3 is connected to the output terminal OTM1 and the output terminal OTM2, and the current added at the output terminal OTM1 and the current added at the output terminal OTM2 are further added.

As described above, in the third embodiment, the plurality of input transistors IT1 to IT8 have a dimension different from each other in correspondence with a plurality of signals to be weighting-added in the adjustment circuit 320 of the fractional frequency dividing circuit 300. For example, each input transistor IT1 to IT8 is configured such that the dimension satisfies equation 1. Thus, the FIR filter (adjustment circuit 320) capable of suppressing the unnecessary tone of the fractional-frequency-divided signal to be generated while frequency-multiplying the K phase signals by m times can be simply configured.

In the third embodiment, the plurality of DA converters DAC1 to DAC4 supply the correction current to the corresponding input transistor of the plurality of input transistors IT1 to IT8 in the adjustment circuit 320 of the fractional frequency dividing circuit 300. Thus, the influence of the shift in dimension caused by the manufacturing variation, and the like of the plurality of input transistors IT1 to IT8 can be reduced.

Fourth Embodiment

A fractional frequency dividing circuit 400 according to a fourth embodiment will now be described. Hereinafter, the portion different from the second embodiment will be centrally described.

In the second embodiment, the fractional-frequency-divided signal output from the adjustment circuit 220 is directly provided to the mixer 98 (see FIG. 24), but in the fourth embodiment, the fractional-frequency-divided signal output from the adjustment circuit 220 is provided to the mixer 98 after being corrected.

Figure 12:
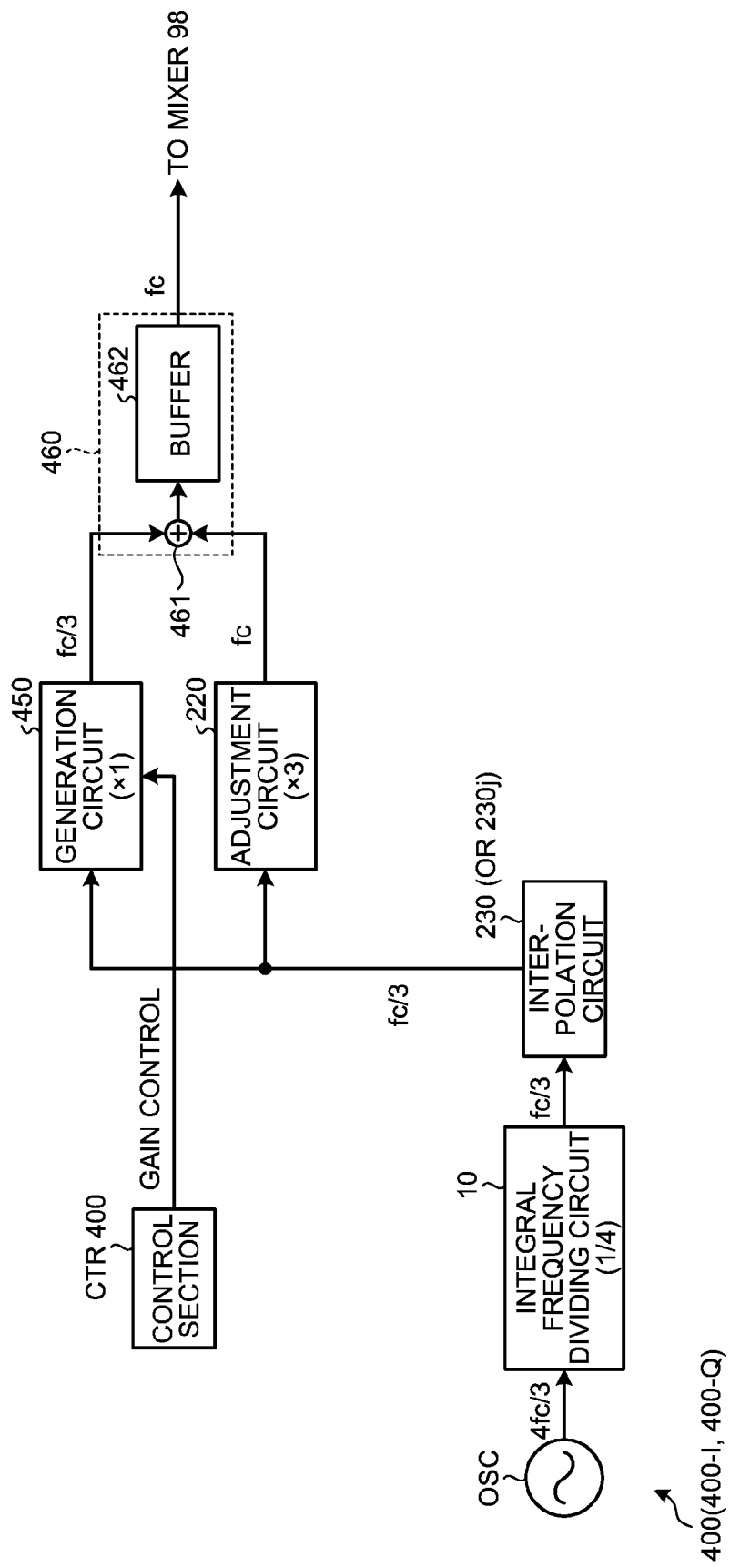
FIG. 12 is a view illustrating a configuration of a fractional frequency dividing circuit according to a fourth embodiment.

Specifically, as illustrated in FIG. 12, the fractional frequency dividing circuit 400 further includes a generation circuit 450 and a correction circuit 460. FIG. 12 is a view illustrating a configuration of the fractional frequency dividing circuit 400.

The generation circuit 450 receives P phase signals from the interpolation circuit 230. The generation circuit 450 weighting-adds the P phase signals, and generates a correction signals having a frequency of one time each of the P phase signals. In other words, the generation circuit 450 generates, as a correction signal, a specific tone having a reverse phase with respect to a specific unnecessary tone and having an amplitude of a substantially equal absolute value so as to cancel out the specific unnecessary tone in the fractional-frequency-divided signal output from the adjustment circuit 220.

The generation circuit 450 has an internal configuration of a configuration of the FIR filter similar to the adjustment circuit 220 (see FIG. 3), but the gain is controlled by the control section CTR 400 to frequency-multiply the P phase signals by one time.

The correction circuit 460 receives the fractional-frequency-divided signal from the adjustment circuit 220, and receives the correction signal from the generation circuit 450. The correction circuit 460 corrects the fractional-frequency-divided signal with the correction signal. The correction circuit 460 includes an adder 461 and a buffer 462. The adder 461 adds the fractional-frequency-divided and the correction signal. The specific unnecessary tone in the fractional-frequency-divided signal output from the adjustment circuit 220 thus can be canceled out. The adder 461 outputs the addition result to the mixer 98 through the buffer 462 as the fractional-frequency-divided signal after the correction.

As described above, in the fourth embodiment, the generation circuit 450 weighting-adds the P phase signals and generates the correction signals having a frequency of one time each of the P phase signals in the fractional frequency dividing circuit 400. The correction circuit 460 corrects the fractional-frequency-divided signal output from the adjustment circuit 220 with the correction signal, and outputs to the mixer 98. Thus, the specific unnecessary tone in the fractional-frequency-divided signal output from the adjustment circuit 220 can be canceled out, and the unnecessary tone in the local signal to be provided to the mixer 98 can be further reduced.

It should be noted that, although in FIG. 12, only one generation circuit 450 is illustrated to simplify the description and illustration, actually four (for ±I and ±Q) generation circuits are necessary.

Alternatively, the fractional frequency dividing circuit 400 may have a configuration in which the interpolation circuit 230 is omitted. In other words, the configuration in which the generation circuit 450 and the correction circuit 460 are added with respect to the configuration (see FIG. 1) of the first embodiment may be adopted.

Fifth Embodiment

A fractional frequency dividing circuit 500 according to a fifth embodiment will now be described. Hereinafter, the portion different from the fourth embodiment will be centrally described.

In the fourth embodiment, the correction signal generated by the generation circuit 450 is directly provided to the correction circuit 460, but a coefficient of the generation circuit 450 (e.g., FIR filter) sometimes contains error. The accuracy of the correction in the correction circuit 460 may possibly lower due to the error of the coefficient.

In the fifth embodiment, the correction signal generated by the generation circuit 450 is provided to the correction circuit 460 after adjusting the amplitude and the phase of the correction signal.

Figure 13:
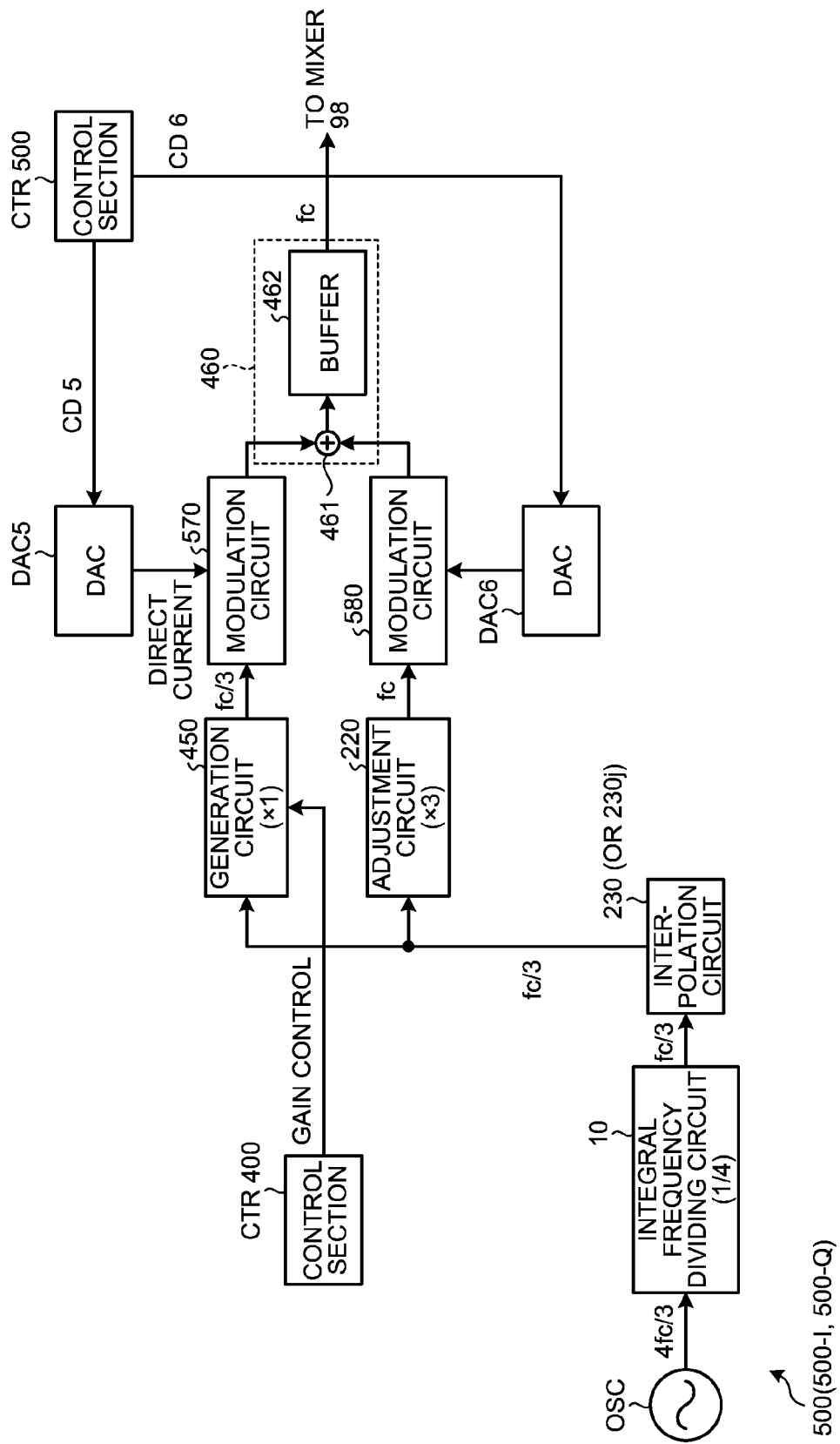
FIG. 13 is a view illustrating a configuration of a fractional frequency dividing circuit according to a fifth embodiment.

Specifically, the fractional frequency dividing circuit 500 further includes a modulation circuit (first modulation circuit) 570, as illustrated in FIG. 13. FIG. 13 is a view illustrating a configuration of the fractional frequency dividing circuit 500.

The modulation circuit 570 adjusts the amplitude and the phase of the correction signal generated by the generation circuit 450 so as to suppress the influence by the error of the coefficient of the generation circuit 450. The modulation circuit 570, for example, adjusts the amplitude and the phase of the correction signal generated by the generation circuit 450 using a principle similar to orthogonal modulation.

It should be noted that the error of the coefficient of the generation circuit 450 can be obtained by measuring the property of the fractional frequency dividing circuit 500 after the manufacturing and before the shipment of the fractional frequency dividing circuit 500. The correction data CD5 corresponding to the measurement result is set in the control section CTR 500. Thus, the control section CTR 500 provides the correction data CD5 to the DA converter DAC5 after the shipment of the fractional frequency dividing circuit 500. The DA converter DAC5 then D/A converts the correction data CD5, and provides the modulation control signal (e.g., DC voltage) to the modulation circuit 570. The modulation circuit 570 adjusts the amplitude and the phase of the correction signal generated by the generation circuit 450 in accordance with the modulation control signal. In other words, the fractional frequency dividing circuit 500 can perform the feed forward control to adjust the amplitude and the phase of the correction signal.

In the fourth embodiment, the fractional-frequency-divided signal generated by the adjustment circuit 220 is directly provided to the correction circuit 460, but the coefficient of the adjustment circuit 220 (e.g., FIR filter) sometimes contains error. The accuracy of the correction in the correction circuit 460 may possibly lower due to the error of the coefficient.

In the fifth embodiment, the fractional-frequency-divided signal generated by the adjustment circuit 220 is provided to the correction circuit 460 after adjusting the amplitude and the phase of the fractional-frequency-divided signal, as illustrated in FIG. 13.

Specifically, the fractional frequency dividing circuit 500 further includes a modulation circuit (second modulation circuit) 580. The modulation circuit 580 adjusts the amplitude and the phase of the fractional-frequency-divided signal generated by the adjustment circuit 220 so as to suppress the influence by the error of the coefficient of the adjustment circuit 220. The modulation circuit 580 adjusts the amplitude and the phase of the fractional-frequency-divided signal generated by the adjustment circuit 220 using the principle similar to the orthogonal modulation, for example.

It should be noted that the error of the coefficient of the adjustment circuit 220 can be obtained by measuring the property of the fractional frequency dividing circuit 500 after the manufacturing and before the shipment of the fractional frequency dividing circuit 500. The correction data CD6 corresponding to the measurement result is set in the control section CTR 500. Thus, the control section CTR 500 provides the correction data CD6 to the DA converter DAC6 after the shipment of the fractional frequency dividing circuit 500. The DA converter DAC6 then D/A converts the correction data CD6, and provides the modulation control signal (e.g., DC voltage) to the modulation circuit 580. The modulation circuit 580 adjusts the amplitude and the phase of the fractional-frequency-divided signal generated by the adjustment circuit 220 in accordance with the modulation control signal. In other words, the fractional frequency dividing circuit 500 can perform the feed forward control to adjust the amplitude and the phase of the fractional-frequency-divided signal.

As described above, in the fifth embodiment, the modulation circuit 570 adjusts the amplitude and the phase of the correction signal generated by the generation circuit 450 and then provides the same to the correction circuit 460 in the fractional-frequency-divided circuit 500. Thus, the fractional-frequency-divided signal can be corrected with the correction signal with the shift in the amplitude and the phase of the correction signal with respect to the fractional-frequency-divided signal reduced, so that the correction accuracy in the correction circuit 460 can be enhanced.

Furthermore, in the fifth embodiment, the modulation circuit 580 adjusts the amplitude and the phase of the fractionalfrequency-divided signal generated by the adjustment circuit 220 and then provides the same to the correction circuit 460 in the fractional-frequency-divided circuit 500. Thus, the fractional-frequency-divided signal can be corrected with the correction signal with the shift in the amplitude and the phase of the fractional-frequency-divided signal with respect to the correction signal reduced, so that the correction accuracy in the correction circuit 460 can be enhanced.

It should be noted, if the error of the coefficient of the adjustment circuit 220 can be ignored, the fractional frequency dividing circuit 500 may have a configuration in which the modulation circuit 580 is omitted. In this case as well, the amplitude and the phase of the correction signal can be adjusted and then provided to the correction circuit 460 by the modulation circuit 570, and hence the fractional-frequency-divided signal can be corrected with the correction signal with the shift in the amplitude and the phase of the correction signal with respect to the fractional-frequency-divided signal reduced.

Alternatively, the fractional frequency dividing circuit 500 may have a configuration in which the interpolation circuit 230 is omitted. In other words, a configuration in which the generation circuit 450, the correction circuit 460, the modulation circuit 570, and the modulation circuit 580 are added with respect to the configuration (see FIG. 1) of the first embodiment may be adopted.

Sixth Embodiment

A fractional frequency dividing circuit 600 according to a sixth embodiment will now be described. Hereinafter, the portion different from the fifth embodiment will be centrally described.

In the fifth embodiment, the feed forward control is performed to adjust the amplitude and the phase of the correction signal, but in the sixth embodiment, the feedback control is performed to adjust the amplitude and the phase of the correction signal.

Figure 14:
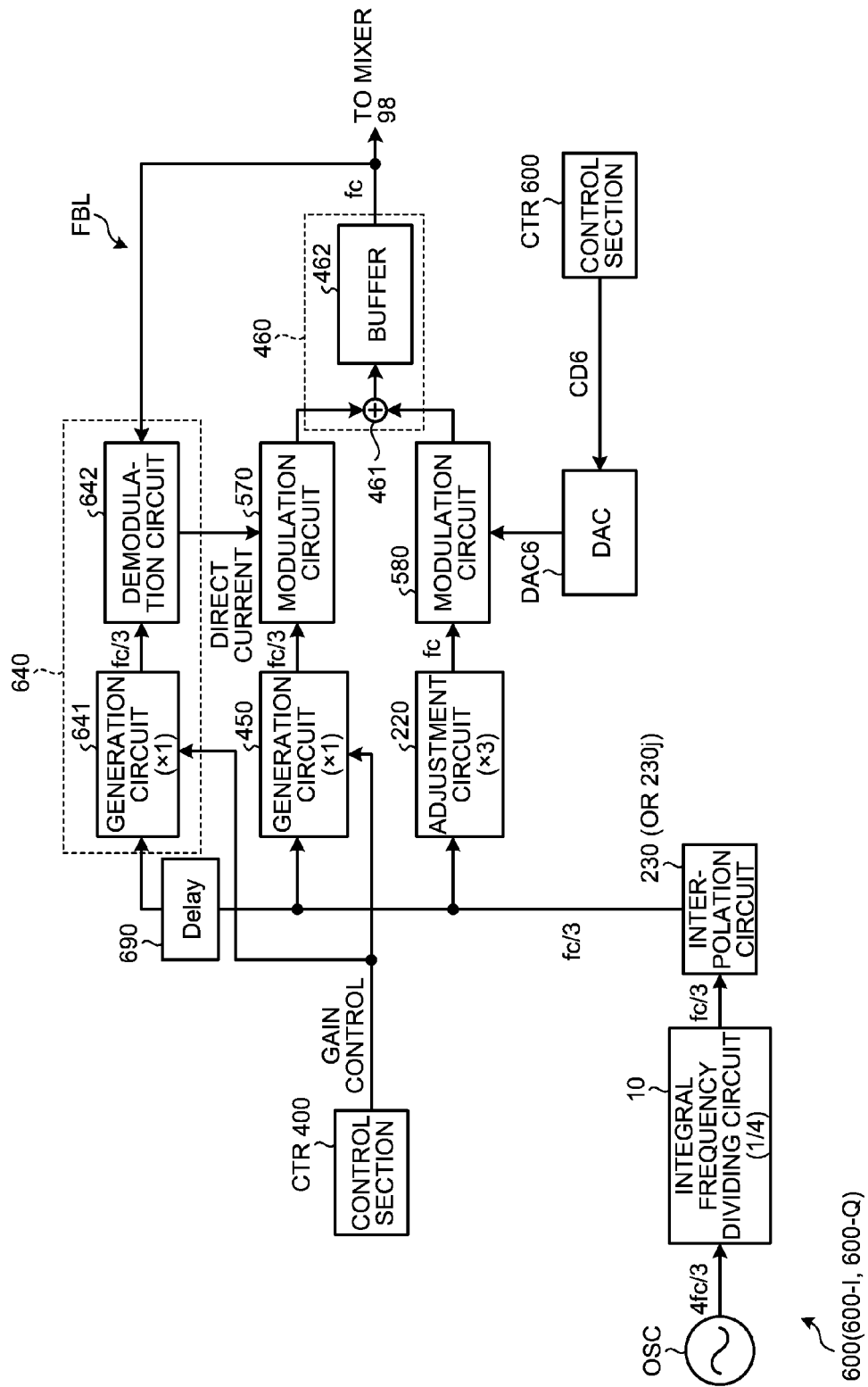
FIG. 14 is a view illustrating a configuration of a fractional frequency dividing circuit according to a sixth embodiment.

Specifically, the fractional frequency dividing circuit 600 further includes a delay circuit 690 and a modulation control circuit 640, as illustrated in FIG. 14. FIG. 14 is a view illustrating a configuration of the fractional frequency dividing circuit 600.

The delay circuit 690 receives the P phase signals from the interpolation circuit 230. The delay circuit 690 delays the P phase signals at a delay amount corresponding to the delay of when feeding back the fractional-frequency-divided signal after the correction from the correction circuit 460 to the modulation control circuit 640 through the feedback line FBL, and then provides the signals to the modulation control circuit 640. For example, the delay circuit 690 includes a D latch circuit of the same number of stages as the number of stages of the D latch in the buffer 462 of the correction circuit 460.

The modulation control circuit 640 is fed back with the fractional-frequency-divided signal after the correction from the correction circuit 460 through the feedback line FBL. The modulation control circuit 640 generates a modulation control signal based on the P phase signals passed through the delay circuit 690 and the signal (fractional-frequency-divided signal after correction) output from the correction circuit 460. The modulation control circuit 640 provides the generated modulation control signal (e.g., DC voltage) to the modulation circuit 570.

Specifically, the modulation control circuit 640 includes a generation circuit 641 and a demodulation circuit 642. The generation circuit 641 has an internal configuration similar to the generation circuit 450. In other words, the generation circuit 641 has an internal configuration of a configuration of the FIR filter similar to the adjustment circuit 220 (see FIG. 3), but the gain is controlled by the control section CTR 400 to frequency-multiply the P phase signals by one time.

The generation circuit 641 receives P phase signals from the delay circuit 690. The generation circuit 641 weighting-adds the P phase signals, generates a reference signals having a frequency of one time each of the P phase signals, and provides the same to the demodulation circuit 642. The reference signal is a signal substantially equal to the correction signal generated by the generation circuit 450.

The demodulation circuit 642 receives the reference signal from the generation circuit 641. The demodulation circuit 642 is fed back with the fractional-frequency-divided signal after the correction from the correction circuit 460 through the feedback line FBL. The demodulation circuit 642 performs demodulation on the fractional-frequency-divided signal after the correction using the principle similar to the orthogonal modulation, for example, and estimates the signal before applying the modulation. The demodulation circuit 642 generates the modulation control signal such that the difference of the absolute value of the amplitude of the reference signal and the absolute value of the amplitude of the specific unnecessary tone (e.g., 3LO2h) in the estimated signal becomes small. The demodulation circuit 642 provides the generated modulation control signal (e.g., DC voltage) to the modulation circuit 570.

As described above, in the sixth embodiment, the modulation control circuit 640 generates the modulation control signal based on the plurality of phase signals passed through the delay circuit 690 and the signal output from the correction circuit 460 and provides the same to the modulation circuit 570. Thus, the influence by the error of the coefficient of the generation circuit 450 can be suppressed even if the error of the coefficient of the generation circuit 450 temporally changed.

The modulation control circuit 640 generates the modulation control signal based on the plurality of phase signals passed through the delay circuit 690 and the signal output from the correction circuit 460. Thus, the delay amount of the path from the interpolation circuit 230 to the modulation control circuit 640 through the delay circuit 690, and the path from the correction circuit 460 to the modulation control circuit 640 through the feedback line FBL becomes substantially equal. As a result, the control accuracy of when generating the modulation control signal can be enhanced.

Seventh Embodiment

A fractional frequency dividing circuit 793 according to a seventh embodiment will now be described. Hereinafter, the portion different from the first embodiment and the third embodiment will be centrally described.

In the first embodiment and the third embodiment, the fractional frequency dividing circuit 100 is arranged at an exterior of the mixer 98 in the transmitter TR, but in the seventh embodiment, the fractional frequency dividing circuit 793 is arranged in the interior of a mixer 798 in the transmitter TR 700.

Figure 15:
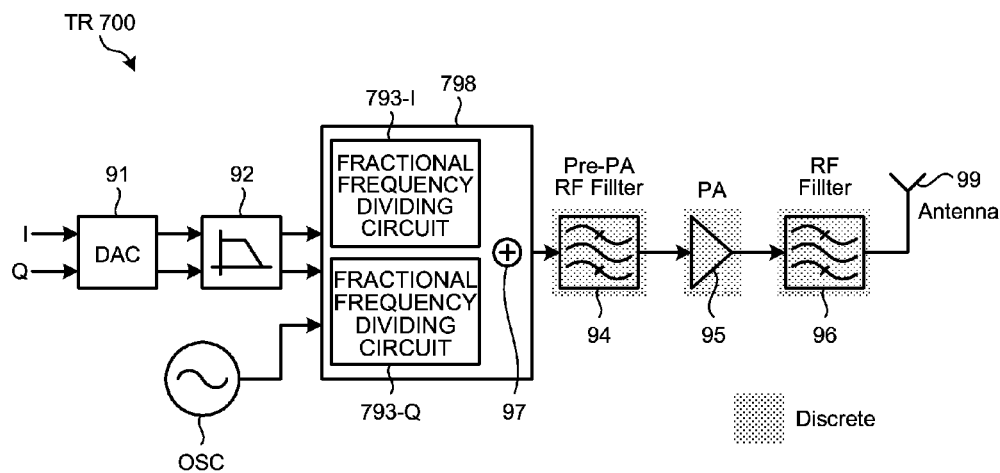
FIG. 15 is a view illustrating a configuration of a transmitter applied with a fractional frequency dividing circuit according to a seventh embodiment.
Figure 16:
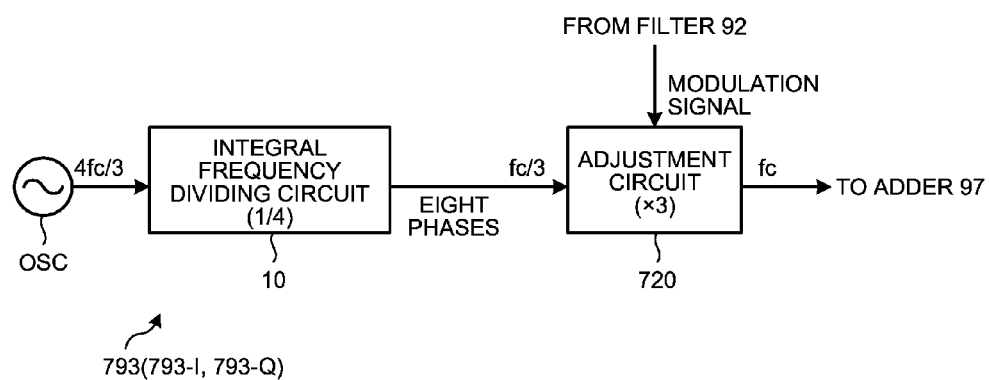
FIG. 16 is a view illustrating a configuration of the fractional frequency dividing circuit according to the seventh embodiment.

Specifically, the transmitter TR 700 includes the mixer 798 in place of the mixer 98 (see FIG. 24), as illustrated in FIG. 15. The mixer 798 does not include the fractional frequency dividing circuit between the mixer and the oscillator OSC. FIG. 15 is a view illustrating a configuration of the transmitter TR 700 applied with the fractional frequency dividing circuit 793.

The mixer 798 includes fractional frequency dividing circuits 793-I, 793-Q in place of the mixers 93-I, 93-Q (see FIG. 24). The fractional frequency dividing circuit 793-I modulates the interiorly generated local signal with the I signal (modulation signal) and frequency-multiplies by m times, and generates the I component signal. The frequency of the I signal is adjusted so as to become fc/m, where fc is the frequency of the signal to be transmitted. The fractional frequency dividing circuit 793-Q modulates the interiorly generated local signal with the Q signal (modulation signal) and frequency-multiplies by m times, and generates the Q component signal. The frequency of the Q signal is adjusted so as to become fc/m, where fc is the frequency of the signal to be transmitted. The adder 97 adds the I component signal and the Q component signal to generate the signal to be transmitted, and outputs the same to the filter 94.

The fractional frequency dividing circuits 793-I, 793-Q are basically similar other than that the phases of the signal to generate differ by π/2, and thus will be mainly described as the fractional frequency dividing circuit 793.

The fractional frequency dividing circuit 793 is similar to the fractional frequency dividing circuit 100 (see FIG. 1) in the basic configuration, and is different from the fractional frequency dividing circuit 100 in that the modulation signal (I signal or Q signal) is input from the filter 92 to the adjustment circuit 720. In other words, the adjustment circuit 720 weighting-adds the plurality of signals and modulates the amplitude and the phase of the plurality of signals with the modulation signal, and generates the fractional-frequency-divided signals having a frequency of m times each of the plurality of phase signals. In the fractional frequency dividing circuit 793, a multi-phase signal (e.g., K phase signals DS1 to DS8) provided from the integral frequency dividing circuit 10 to the adjustment circuit 720 can be assumed as the interiorly generated local signal. In this case, the adjustment circuit 720 has both the function of the circuit for weighting-adding the multi-phase signals, and the function of the mixer for modulating the local signal with the modulation signal.

Specifically, the adjustment circuit 720 includes a plurality of bias transistors BT701 to BT704 in place of the plurality of bias transistors BT1 to BT4 (see FIG. 11). The plurality of bias transistors BT701 to BT704 are each provided at the gate with the modulation signal, and respectively functions as the variable current source. In other words, each bias transistor BT701 to BT704 changes the current value to flow to the corresponding input transistors IT1 to IT8 in response to the modulation signal. The drain current supplied from the plurality of input transistors IT1 to IT8 to the output terminals OTM1 to OTM3 is assumed to have a current value applied with modulation corresponding to the modulation signal. Thus, the adjustment circuit 720 can also function as the mixer for modulating the local signal with the modulation signal.

For example, the AM modulation can be carried out if the bias is simply increased or reduced in the adjustment circuit 720. Alternatively, for example, the balanced modulation can be carried out by combining the positive and negative modulations. Alternatively, for example, the orthogonal modulation can be carried out by further combining I/Q.

As described above, in the seventh embodiment, the mixer 798 includes the fractional frequency dividing circuits 793-I, 793-Q in the transmitter TR 700. The mixer 798 generates the signal to be transmitted using the fractional-frequency-divided signals output from the fractional frequency dividing circuits 793-I, 793-Q. Thus, the local signal can be interiorly generated in the mixer 798, and the interiorly generated local signal can be modulated with the modulation signal, so that the fractional frequency dividing circuit does not need to be arranged between the mixer 798 and the oscillator OSC. As a result, the configuration of the transmitter TR 700 can be simplified.

Furthermore, in the seventh embodiment, the adjustment circuit 720 weighting-adds K phase signals and modulates the amplitude and the phase of the K phase signals with the modulation signal, and generates the fractional-frequency-divided signals having a frequency of m times each of the K phase signals in the fractional frequency dividing circuit 793. The adjustment circuit 720 thus can serve as a circuit for weighting-adding the multi-phase signal, and the mixer for modulating the local signal with the modulation signal.

Figure 18:
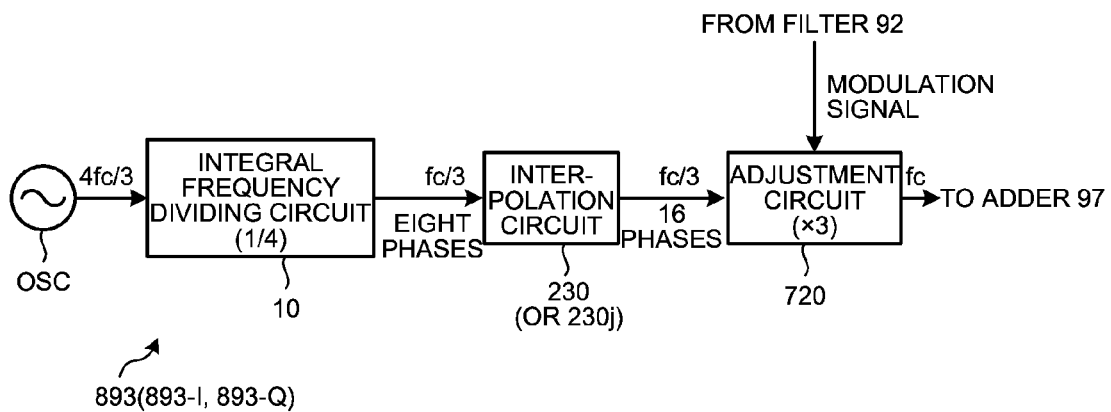
FIG. 18 is a view illustrating a configuration of a fractional frequency dividing circuit according to a variant of the seventh embodiment.

It should be noted that the way of thinking of the seventh embodiment may be applied to the second embodiment. For example, as illustrated in FIG. 18, a fractional frequency dividing circuit 893 (893-I, 893-Q) can be configured by replacing the adjustment circuit 220 (see FIG. 5) in the fractional frequency dividing circuit 200 of the second embodiment with an adjustment circuit 720. The adjustment circuit 720 is different from the adjustment circuit 220 in that the modulation signal is input from the filter 92.

Figure 17:
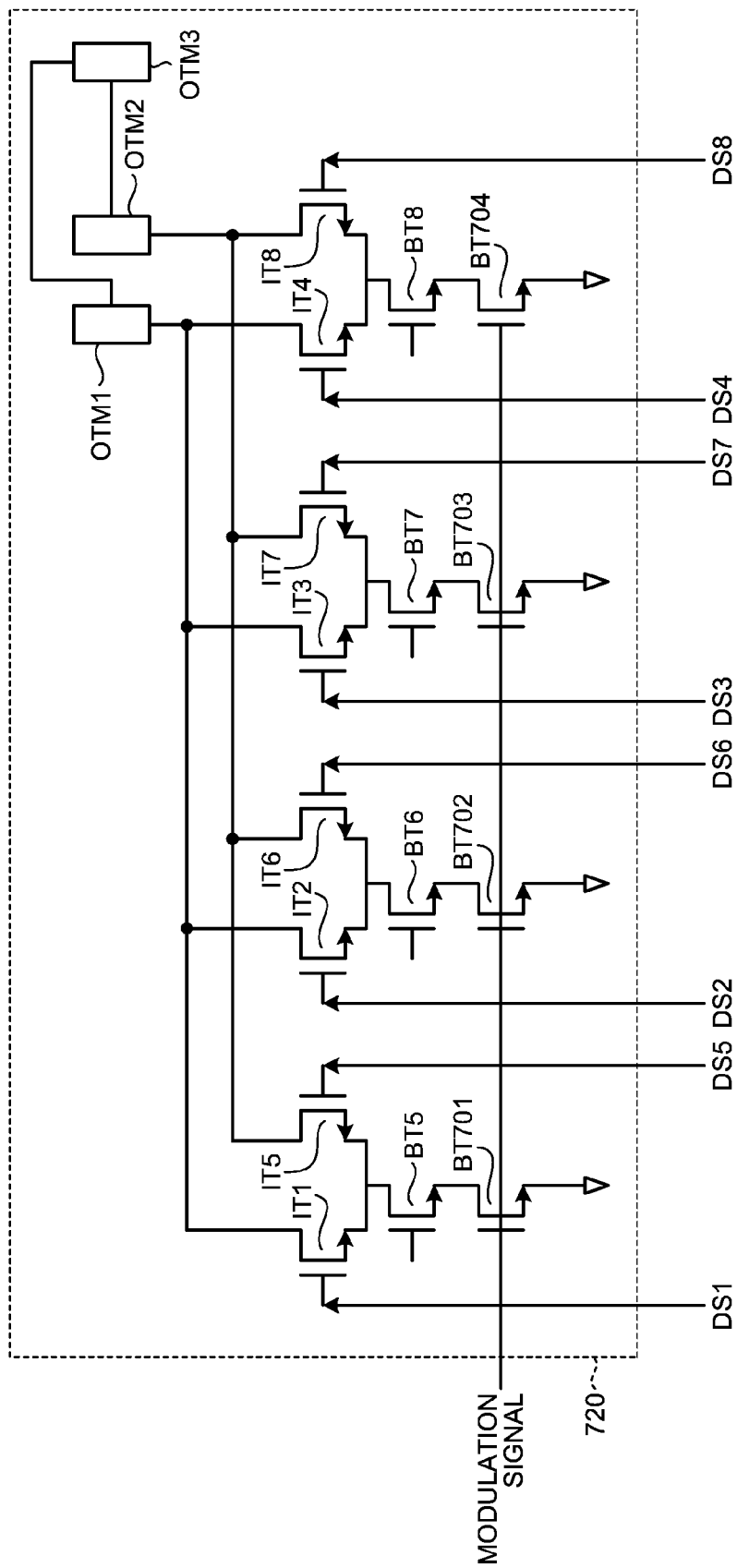
FIG. 17 is a view illustrating a configuration of an adjustment circuit according to the seventh embodiment.
Figure 19:
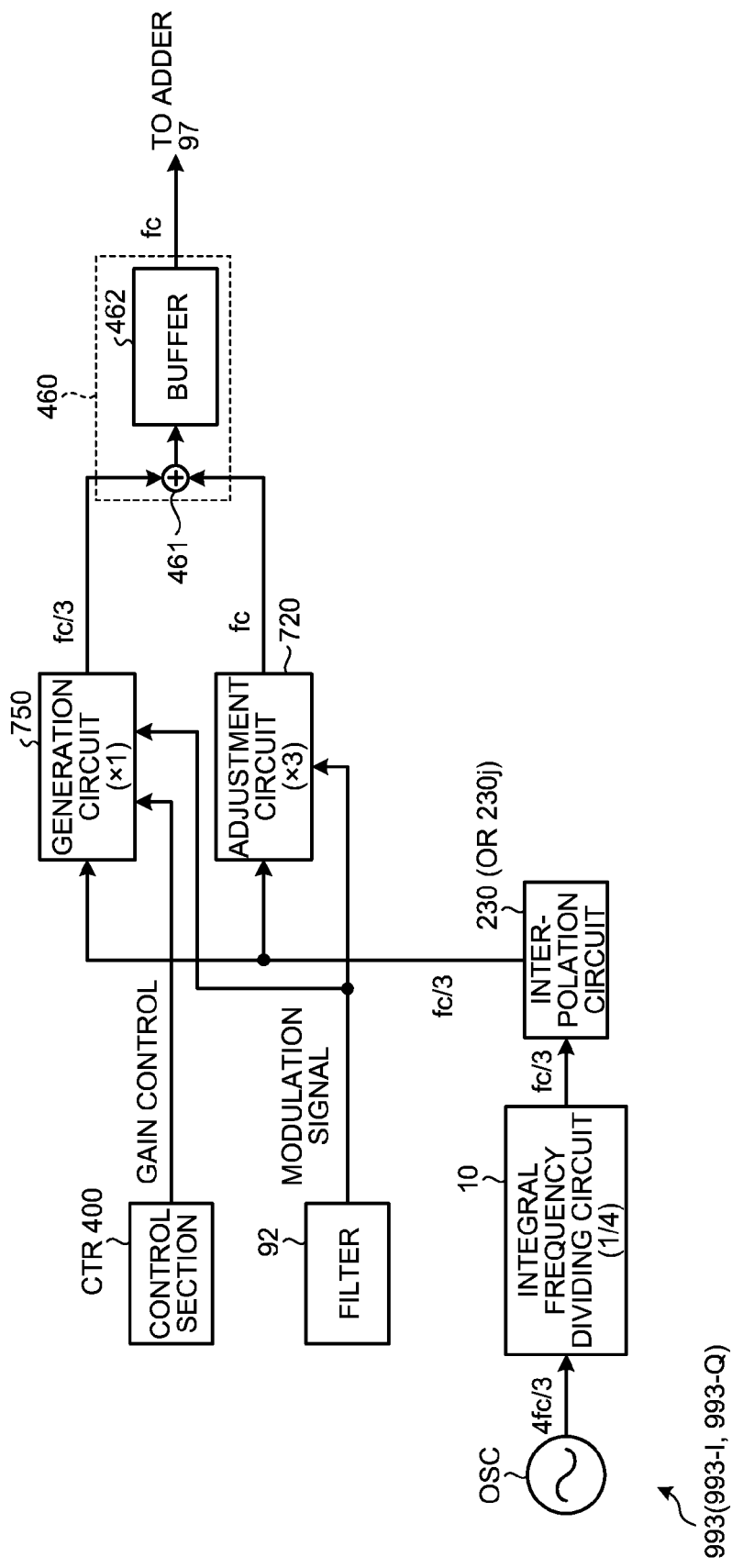
FIG. 19 is a view illustrating a configuration of a fractional frequency dividing circuit according to another variant of the seventh embodiment.

Alternatively, the way of thinking of the seventh embodiment may be applied to the fourth embodiment. For example, as illustrated in FIG. 19, a fractional frequency dividing circuit 993 can be configured by replacing the generation circuit 450 and the adjustment circuit 220 (see FIG. 12) in the fractional frequency dividing circuit 400 of the fourth embodiment with the generation circuit 750 and the adjustment circuit 720. The generation circuit 750 has an internal configuration of a configuration of the FIR filter similar to the adjustment circuit 720 (see FIG. 17), but the gain is controlled by the control section CTR 400 to frequency-multiply the P phase signals by one time. The generation circuit 750 and the adjustment circuit 720 respectively differ from the generation circuit 450 and the adjustment circuit 220 in that the modulation signal is input from the filter 92.

Figure 20:
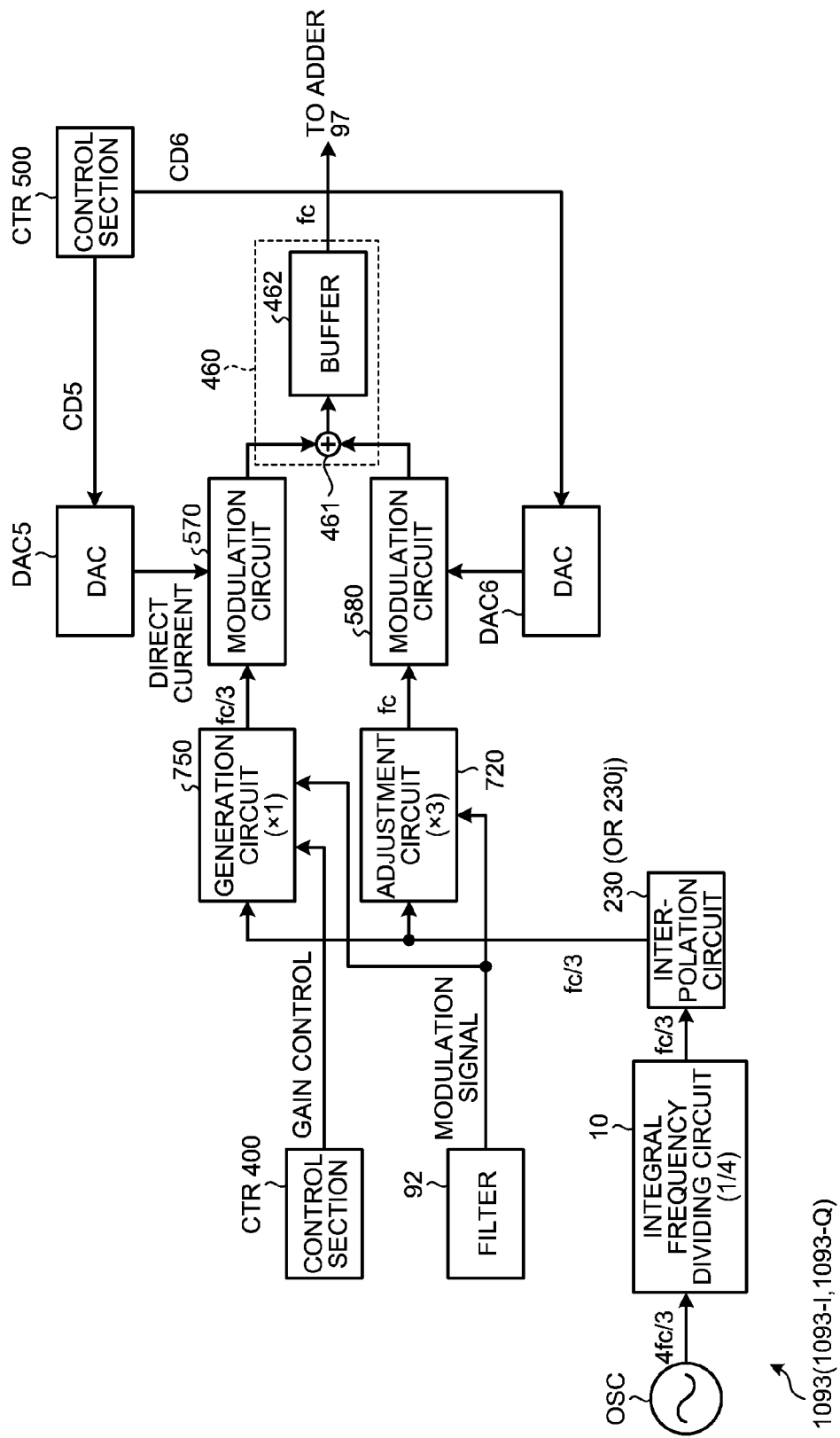
FIG. 20 is a view illustrating a configuration of a fractional frequency dividing circuit according to another variant of the seventh embodiment.

Alternatively, the way of thinking of the seventh embodiment may be applied to the fifth embodiment. For example, as illustrated in FIG. 20, a fractional frequency dividing circuit 1093 can be configured by replacing the generation circuit 450 and the adjustment circuit 220 (see FIG. 13) in the fractional frequency dividing circuit 500 of the fifth embodiment with the generation circuit 750 and the adjustment circuit 720. The generation circuit 750 has an internal configuration of a configuration of the FIR filter similar to the adjustment circuit 720 (see FIG. 17), but the gain is controlled by the control section CTR 400 to frequency-multiply the P phase signals by one time. The generation circuit 750 and the adjustment circuit 720 respectively differ from the generation circuit 450 and the adjustment circuit 220 in that the modulation signal is input from the filter 92.

Figure 21:
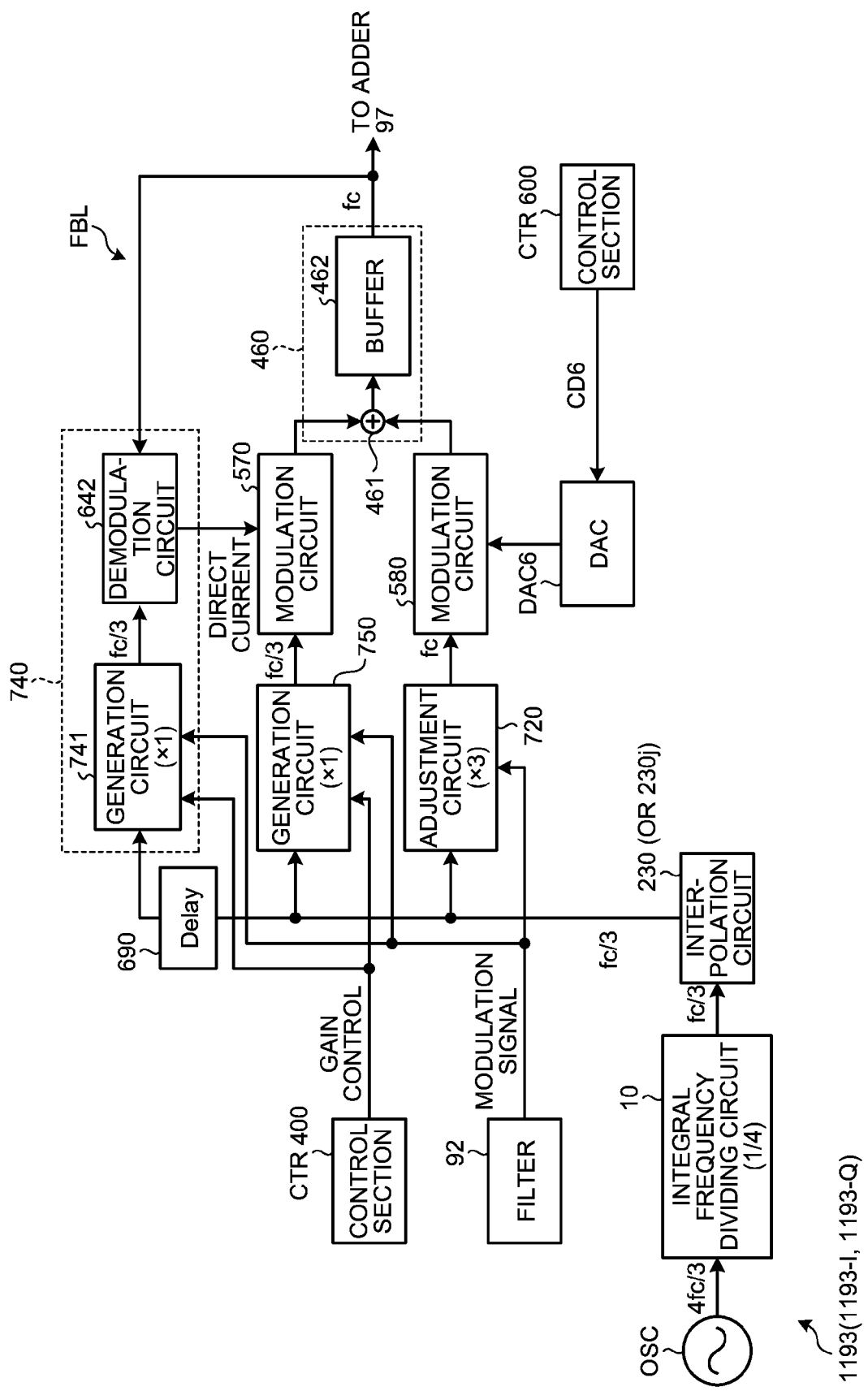
FIG. 21 is a view illustrating a configuration of a fractional frequency dividing circuit according to another variant of the seventh embodiment.

Alternatively, the way of thinking of the seventh embodiment may be applied to the sixth embodiment. For example, as illustrated in FIG. 21, a fractional frequency dividing circuit 1193 can be configured by replacing the generation circuit 641, the generation circuit 450, and the adjustment circuit 220 (see FIG. 14) in the fractional frequency dividing circuit 600 of the sixth embodiment with the generation circuit 750 and the adjustment circuit 720. The generation circuit 741 in the modulation control circuit 740 has an internal configuration of a configuration of the FIR filter similar to the adjustment circuit 720 (see FIG. 17), but the gain is controlled by the control section CTR 400 to frequency-multiply the P phase signals by one time. The generation circuit 750 has an internal configuration of a configuration of the FIR filter similar to the adjustment circuit 720 (see FIG. 17), but the gain is controlled by the control section CTR 400 to frequency-multiply the P phase signals by one time. The generation circuit 750 and the adjustment circuit 720 respectively differ from the generation circuit 450 and the adjustment circuit 220 in that the modulation signal is input from the filter 92.

Eighth Embodiment

A fractional frequency dividing circuit 1200 according to an eight embodiment will now be described. Hereinafter, the portion different from the basic mode will be centrally described.

In the basic mode, the suppression of the unnecessary tone in the fractional-frequency-divided signal is achieved by passing through the band pass filter 4, but in the eighth embodiment, the suppression of the unnecessary tone in the fractional-frequency-divided signal is achieved by correcting with the correction signal.

Figure 22:
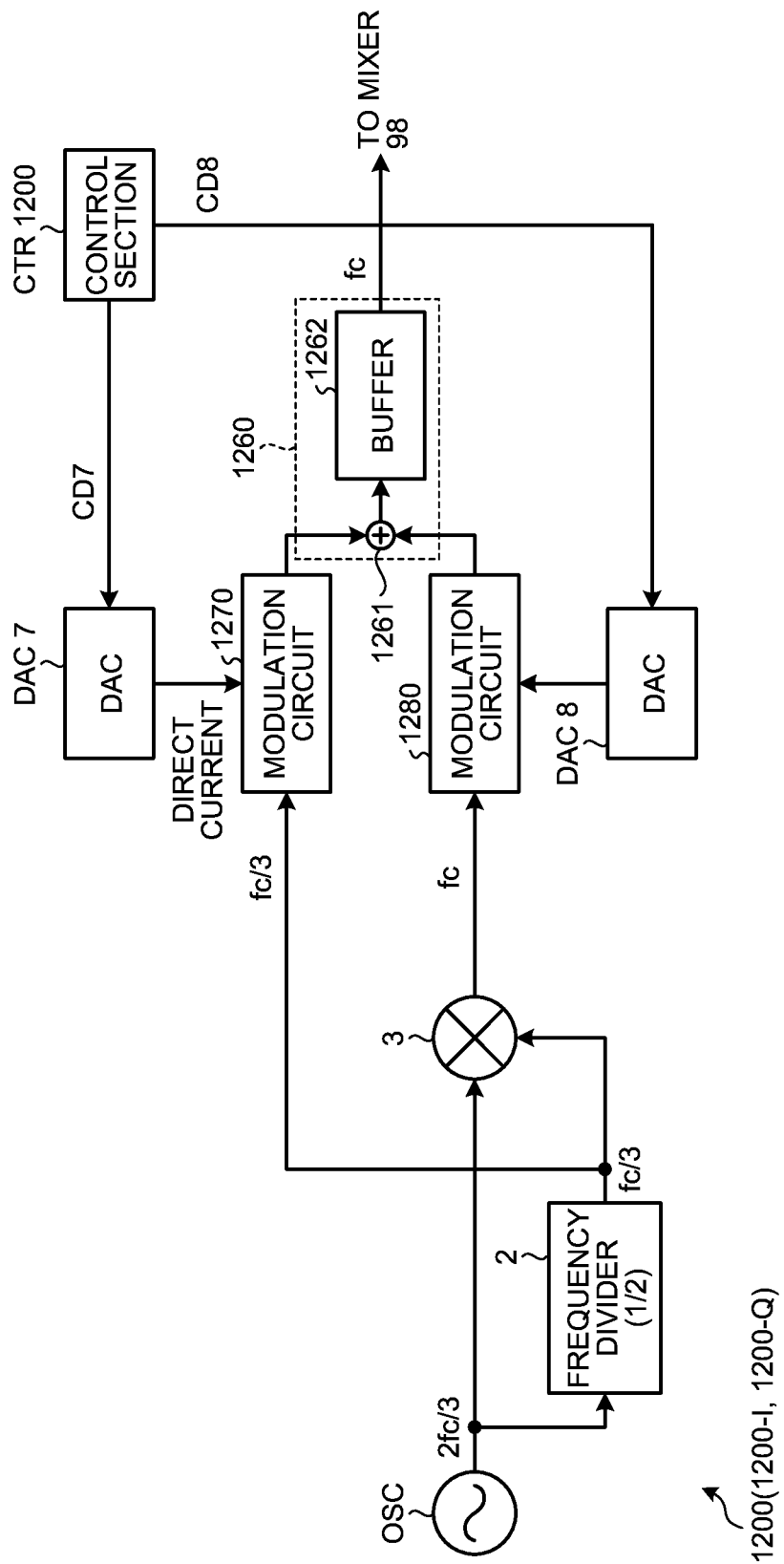
FIG. 22 is a view illustrating a configuration of a fractional frequency dividing circuit according to an eighth embodiment.

Specifically, the fractional frequency dividing circuit 1200 includes a modulation circuit 1270, a modulation circuit 1280, and a correction circuit 1260 in place of the band pass filter 4 (see FIG. 25), as illustrated in FIG. 22. FIG. 22 is a view illustrating a configuration of the fractional frequency dividing circuit 1200.

The modulation circuit 1270 adjusts the amplitude and the phase of the frequency divided signal generated by the frequency divider 2 so as to suppress the influence by the error of the coefficient of the frequency divider 2. The modulation circuit 1270, for example, adjusts the amplitude and the phase of the frequency divided signal generated by the frequency divider 2 using a principle similar to orthogonal modulation. The modulation circuit 1270 provides the frequency divided signal, in which the amplitude and the phase are adjusted, to the correction circuit 1260 as the correction signal.

The error of the coefficient of the frequency divider 2 can be obtained by measuring the property of the fractional-frequency-divided circuit 1200 after the manufacturing and before the shipment of the fractional frequency dividing circuit 1200. The control section CTR 1200 is set with correction data CD7 corresponding to the measurement result. Thus, the control section CTR 1200 provides the correction data CD7 to the DA converter DAC7 after the shipment of the fractional frequency dividing circuit 1200. The DA converter DAC7 then D/A converts the correction data CD7, and provides the modulation control signal (e.g., DC voltage) to the modulation circuit 1270. The modulation circuit 1270 adjusts the amplitude and the phase of the frequency divided signal generated by the frequency divider 2 in accordance with the modulation control signal. In other words, the fractional frequency dividing circuit 1200 can perform the feed forward control to adjust the amplitude and the phase of the frequency divided signal.

The modulation circuit 1280 adjusts the amplitude and the phase of the fractional-frequency-divided signal generated by the multiplier 3 so as to suppress the influence by the error of the coefficient of the multiplier 3. The modulation circuit 1280 adjusts the amplitude and the phase of the fractional-frequency-divided signal generated by the multiplier 3 using the principle similar to the orthogonal modulation, for example, and provides the same to the correction circuit 1260.

It should be noted that the error of the coefficient of the multiplier 3 can be obtained by measuring the property of the fractional-frequency-divided circuit 1200 after the manufacturing and before the shipment of the fractional frequency dividing circuit 1200. The control section CTR 1200 is set with correction data CD8 corresponding to the measurement result. Thus, the control section CTR 1200 provides the correction data CD8 to the DA converter DAC8 after the shipment of the fractional frequency dividing circuit 1200. The DA converter DAC8 then D/A converts the correction data CD8, and provides the modulation control signal (e.g., DC voltage) to the modulation circuit 1280. The modulation circuit 1280 adjusts the amplitude and the phase of the fractional-frequency-divided signal generated by the multiplier 3 in accordance with the modulation control signal. In other words, the fractional frequency dividing circuit 1200 can perform the feed forward control to adjust the amplitude and the phase of the fractional-frequency-divided signal.

The correction circuit 1260 receives the fractional-frequency-divided signal from the modulation circuit 1280, and receives the correction signal from the modulation circuit 1270. The correction circuit 1260 corrects the fractional-frequency-divided signal with the correction signal. The correction circuit 1260 includes an adder 1261 and a buffer 1262. The adder 1261 adds the fractional-frequency-divided signal and the correction signal. The specific unnecessary tone in the fractional-frequency-divided signal output from the multiplier 3 thus can be canceled out. The adder 1261 outputs the addition result to the mixer 98 (see FIG. 24) through the buffer 1262 as the fractional-frequency-divided signal after the correction.

As described above, in the eighth embodiment, the correction circuit 1260 corrects the fractional-frequency-divided signal output from the multiplier 3 with the correction signal, and outputs to the mixer 98 in the fractional frequency dividing circuit 1200. Thus, the specific unnecessary tone in the fractional-frequency-divided signal output from the multiplier 3 can be canceled out, and the unnecessary tone in the local signal to be provided to the mixer 98 can be further reduced.

In the eighth embodiment, the modulation circuit 1270 adjusts the amplitude and phase of the frequency divided signal generated by the frequency divider 2 and provides the same to the correction circuit 1260 as the correction signal in the fractional frequency dividing circuit 1200. Thus, the fractional-frequency-divided signal can be corrected with the correction signal with the shift of the amplitude and the phase of the correction signal with respect to the fractional-frequency-divided signal reduced, so that the correction accuracy in the correction circuit 1260 can be enhanced.

In the eighth embodiment, the modulation circuit 1280 adjusts the amplitude and phase of the frequency divided signal generated by the multiplier 3 and provides the same to the correction circuit 1260 in the fractional frequency dividing circuit 1200. Thus, the fractional-frequency-divided signal can be corrected with the correction signal with the shift of the amplitude and the phase of the fractional-frequency-divided signal with respect to the correction signal reduced, so that the correction accuracy in the correction circuit 1260 can be enhanced.

It should be noted that the fractional frequency dividing circuit may perform the feedback control instead of the feed forward control to adjust the amplitude and the phase of the correction signal.

Figure 23:
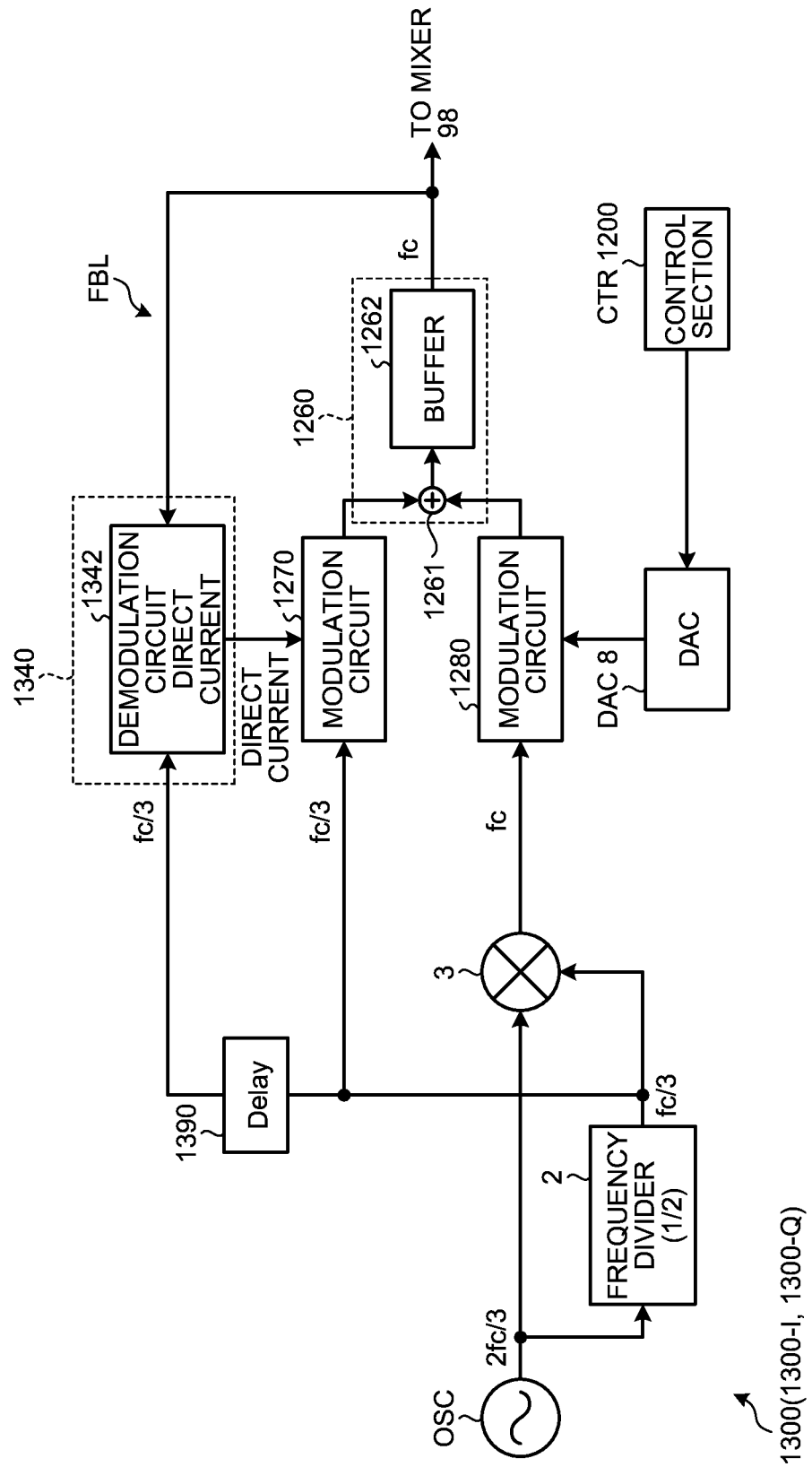
FIG. 23 is a view illustrating a configuration of a fractional frequency dividing circuit according to a variant of the eighth embodiment.

Specifically, a fractional frequency dividing circuit 1300 further includes a delay circuit 1390 and a modulation control circuit 1340, as illustrated in FIG. 23. FIG. 23 is a view illustrating a configuration of the fractional frequency dividing circuit 1300.

The delay circuit 1390 receives the frequency divided signal from the frequency divider 2. The delay circuit 1390 delays the frequency divided signal at a delay amount corresponding to the delay of when feeding back the fractionalfrequency-divided signal after the correction from the correction circuit 1260 to the modulation control circuit 1340 through the feedback line FBL. The delay circuit 1390 provides the delayed frequency divided signal to the modulation control circuit 1340 as the reference signal. For example, the delay circuit 1390 includes a D latch circuit of the same number of stages as the number of stages of the D latch in the buffer 1262 of the correction circuit 1260.

The modulation control circuit 1340 is fed back with the fractional-frequency-divided signal after the correction from the correction circuit 1260 through the feedback line FBL. The modulation control circuit 1340 generates a modulation control signal based on the frequency divided signal passed through the delay circuit 1390 and the signal (fractional-frequency-divided signal after correction) output from the correction circuit 1260. The modulation control circuit 1340 provides the generated modulation control signal (e.g., DC voltage) to the modulation circuit 1270.

Specifically, the modulation control circuit 1340 includes a demodulation circuit 1342. The demodulation circuit 1342 receives the reference signal from the delay circuit 1390. The demodulation circuit 1342 is fed back with the fractional-frequency-divided signal after the correction from the correction circuit 1260 through the feedback line FBL. The demodulation circuit 1342 performs demodulation on the fractional-frequency-divided signal after the correction using the principle similar to the orthogonal modulation, for example, and estimates the signal before applying the modulation. The demodulation circuit 1342 generates the modulation control signal such that the difference of the absolute value of the amplitude of the reference signal and the absolute value of the amplitude of the specific unnecessary tone (e.g., 3LO2h) in the estimated signal becomes smaller. The demodulation circuit 1342 provides the generated modulation control signal (e.g., DC voltage) to the modulation circuit 1270.

Therefore, in the fractional frequency dividing circuit 1300, the modulation control circuit 1340 generates the modulation control signal and provides the same to the modulation circuit 1270 based on the plurality of phase signals passed through the delay circuit 1390 and the signal output from the correction circuit 1260. Thus, the influence by the error of the coefficient of the frequency divider 2 can be suppressed even if the error of the coefficient of the frequency divider 2 is temporally changed.

The modulation control circuit 1340 generates a modulation control signal based on the frequency divided signal passed through the delay circuit 1390 and the signal output from the correction circuit 1260. Thus, the delay amount of the path from the frequency divider 2 to the modulation control circuit 1340 through the delay circuit 1390, and the path from the correction circuit 1260 to the modulation control circuit 1340 through the feedback line FBL becomes substantially equal. As a result, the control accuracy of when generating the modulation control signal can be enhanced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A fractional frequency dividing circuit comprising:
    an integral frequency dividing circuit configured to convert a reference signal to K (K is a positive integer) phase signals each having a frequency of one nth (n is a positive integer) of the reference signal and having different phases from each other; and
    an adjustment circuit configured to add the K phase signals, each with some gains and to generate a fractional-frequency-divided signal having a frequency of m times (m is a positive integer that is not multiplies of n) of each of the plurality of phase signals.

2. The fractional frequency dividing circuit according to claim 1, wherein
    the integral frequency dividing circuit includes K/2 delay circuits configured to transfer the signal in synchronization with the reference signal and output two signals in which the phases are inverted from each other; and
    the adjustment circuit includes
    K amplifiers configured to amplify at fixed gains different from each other in correspondence with the K phase signals, and
    an adder configured to add the amplified K phase signals.

3. The fractional frequency dividing circuit according to claim 2, wherein the fixed gain is a real part or an imaginary part of $w^{3N}$ (N=0, 1, 2, . . . , K−1), where w is the weight of Fourier transformation.

4. The fractional frequency dividing circuit according to claim 1, further comprising
    an interpolation circuit configured to interpolate phase signals between the K phase signals, and to generate P (P is an integer greater than K) phase signals having different phases from each other, wherein
    the adjustment circuit weighting-adds the P phase signals.

5. The fractional frequency dividing circuit according to claim 4, wherein
    the integral frequency dividing circuit includes K/2 delay circuits configured to transfer the signal in synchronization with the reference signal and output two signals in which the phases are inverted from each other,
    the interpolation circuit includes
    K pairs of capacitors each interpolating a phase signal between two phase signals having the closest phases of the K phase signals, and
    the adjustment circuit includes
    P amplifiers configured to amplify at fixed gains different from each other in correspondence with the P phase signals, and
    an adder configured to add the amplified P phase signals.

6. The fractional frequency dividing circuit according to claim 5, wherein the fixed gain is a real part or an imaginary part of $w^{3N}$ (N=0, 1, 2, . . . , P−1), where w is the weight of Fourier transformation.

7. The fractional frequency dividing circuit according to claim 4, wherein
    the integral frequency dividing circuit includes K/2 delay circuits configured to transfer the signal in synchronization with the reference signal and output two signals in which the phases are inverted from each other;
    the interpolation circuit includes
    K groups of capacitors each interpolating a phase signal between two phase signals having the closest phases of the K phase signals in view of the adjacent phase signals having the next closest phase with respect to the two phase signals, and the adjustment circuit includes
P amplifiers configured to amplify at fixed gains different from each other in correspondence with the P phase signals, and
an adder configured to add the amplified P phase signals.

8. The fractional frequency dividing circuit according to claim 7, wherein the fixed gain is a real part or an imaginary part of $w^{3N}$ (N=0, 1, 2, ..., P−1), where w is the weight of Fourier transformation.

9. The fractional frequency dividing circuit according to claim 1, wherein
the adjustment circuit includes a plurality of transistors having dimensions different from each other in correspondence with a plurality of signals to be weighting-added.

10. The fractional frequency dividing circuit according to claim 9, wherein
the adjustment circuit further includes a plurality of DA converters configured to supply a correction current to a corresponding transistor of the plurality of transistors.

11. The fractional frequency dividing circuit according to claim 1, wherein
the adjustment circuit further includes
a generation circuit configured to weighting-add a plurality of signals corresponding to the K phase signals and generate a correction signals having a frequency of one time each of the plurality of phase signals, and
a correction circuit configured to correct the generated fractional-frequency-divided signal with the generated correction signal.

12. The fractional frequency dividing circuit according to claim 1, further comprising:
a generation circuit configured to weighting-add a plurality of signals corresponding to the K phase signals and generate a correction signals having a frequency of one time each of the plurality of phase signals;
a first modulation circuit configured to adjust amplitude and phase of the generated correction signal; and
a correction circuit configured to correct the generated fractional-frequency-divided signal with the adjusted correction signal.

13. The fractional frequency dividing circuit according to claim 1, further comprising:
a generation circuit configured to weighting-add a plurality of signals corresponding to the K phase signals and generate a correction signal having a frequency of one time each of the plurality of phase signals;
a first modulation circuit configured to adjust amplitude and phase of the generated correction signal;
a second modulation circuit configured to adjust amplitude and phase of the generated fractional-frequency-divided signal; and
a correction circuit configured to correct the adjusted fractional-frequency-divided signal with the adjusted correction signal.

14. The fractional frequency dividing circuit according to claim 1, wherein n is four, and m is three or five.

15. The fractional frequency dividing circuit according to claim 1, wherein n is eight, and m is three or five.

16. The fractional frequency dividing circuit according to claim 12, further comprising:
a delay circuit configured to receive a plurality of signals corresponding to the K phase signals; and
a modulation control circuit configured to generate a modulation control signal based on a plurality of phase signals passed through the delay circuit and a signal output from the correction circuit, and provide the generated modulation control signal to the first modulation circuit.

17. The fractional frequency dividing circuit according to claim 1, wherein
the adjustment circuit weighting-adds a plurality of signals corresponding to the K phase signals and modulates amplitude and phase of the plurality of signals with a modulation signal, and generates a fractional-frequency-divided signal having a frequency of m times each of the plurality of phase signals.

18. A transmitter comprising:
the fractional frequency dividing circuit according to claim 1; and
a mixer configured to modulate the fractional-frequency-divided signal output from the fractional frequency dividing circuit with a modulation signal, and generate a signal to be transmitted.

19. A transmitter comprising:
a mixer that has the fractional frequency dividing circuit according to claim 17, the mixer being configured to generate a signal to be transmitted using a fractional-frequency-divided signal output from the fractional frequency dividing circuit.

* * * * *